(12) United States Patent
Kondo et al.

(10) Patent No.: US 6,336,569 B1
(45) Date of Patent: Jan. 8, 2002

(54) ARRANGING AND SUPPLYING APPARATUS

(75) Inventors: Yoshiyuki Kondo, Nagoya; Takeshi Kondo, Chiryu, both of (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 46 days.

(21) Appl. No.: 09/588,024

(22) Filed: Jun. 6, 2000

(30) Foreign Application Priority Data

Jun. 25, 1999 (JP) .......................................... 11-180177

(51) Int. Cl.[7] ................................................ B65H 3/60
(52) U.S. Cl. ...................... 221/200; 221/167; 198/383; 198/390; 198/396; 198/443
(58) Field of Search ................................ 221/200, 163, 221/167, 168, 236, 268; 198/390, 383, 396, 443, 382, 374, 438; 193/44

(56) References Cited

U.S. PATENT DOCUMENTS

| 3,970,218 A | * | 7/1976 | Lee .............................. 221/157 |
| 4,953,749 A | * | 9/1990 | Kubota et al. ............... 221/168 |
| 5,636,725 A | * | 6/1997 | Saito et al. .................. 198/396 |
| 5,934,505 A |   | 8/1999 | Shimada |
| 6,264,061 B1 | * | 7/2001 | Fukai et al. ................. 221/171 |

FOREIGN PATENT DOCUMENTS

| JP | A-8-48419 | 2/1996 |
| JP | A-11-20933 | 1/1999 |

\* cited by examiner

*Primary Examiner*—Christopher P. Ellis
*Assistant Examiner*—Khoi H. Tran
(74) *Attorney, Agent, or Firm*—Oliff & Berridge, PLC

(57) ABSTRACT

An apparatus for arranging and supplying a plurality of objects, the apparatus including a hopper which stores the objects in bulk and which has a funnelform bottom surface at least a portion of which extends in a reference direction inclined with respect to a horizontal plane, a chute which includes an end portion extending, from a lowest portion of the hopper, substantially parallel to the reference direction, and which causes the objects arranged in an array to be moved, a discharging-promoting member which is provided in a vicinity of the end portion of the chute, which is movable substantially parallel to the reference direction, and which promotes discharging of the objects from the hopper to the chute while arranging the objects into the array, and a drive device which reciprocates, relative to the chute, the discharging-promoting member between an advanced position where an end portion of the discharging-promoting member projects into the hopper and a retracted position away from the advanced position.

20 Claims, 16 Drawing Sheets

ARRANGING AND SUPPLYING APPARATUS

BACKGROUND OF THE INVENTION

1. Field of the Invention

The present invention relates to an apparatus for arranging a number of objects into an array and supplying the objects arranged in the array, and particularly to the art of improving reliability with which the apparatus supplies the objects.

2. Related Art Statement

Japanese Patent Application Laid open for inspection under Publication No. 8(1996)-48419 discloses an example of the above-indicated apparatus. This apparatus includes a hopper, a chute, and a discharging-promoting tube. The hopper stores a number of objects in bulk, i.e., in such a manner that each object takes an arbitrary posture. An initial-end portion of the chute is connected to an outlet of the hopper. The discharging-promoting tube is provided in the vicinity of the initial-end portion of the chute, such that the tube is vertically movable relative to the chute. The tube has an inner passage which provides a portion of the initial-end portion of the chute. The vertical movement of the tube moves objects which clog the outlet of the hopper, and/or objects which engage each other and prevent each other from entering the chute, that is, make a "bridge" over the chute. Thus, the tube eliminates the clogging and/or the bridge, thereby promoting discharging of the objects into the chute.

However, though the discharging-promoting tube is vertically moved, objects may not enter the tube with high reliability and the apparatus may fail to supply the objects.

SUMMARY OF THE INVENTION

The present invention provides an arranging and supplying apparatus which has one or more of the technical features that are described below in respective paragraphs give parenthesized sequential numbers (1) to (20). Any technical feature which includes another technical feature shall do so by referring, at the beginning, to the parenthesized sequential number given to the latter feature. Thus, two or more of the following technical features may be combined, if appropriate. Each technical feature may be accompanied by a supplemental explanation, as needed. However, the following technical features and the appropriate combinations thereof are just examples to which the present invention is by no means limited. In addition, in the case where one technical feature recites a plurality of items, it is not essentially required that all those items be simultaneously employed. That is, it is possible that only a portion (one, two, . . . , but not all) of those items be selected and employed.

(1) According to a first feature of the present invention, there is provided an apparatus for arranging and supplying a plurality of objects, the apparatus comprising a hopper which stores the objects in bulk and which has a funnelform bottom surface at least a portion of which extends in a reference direction inclined with respect to a horizontal plane; a chute which includes an end portion extending, from a lowest portion of the hopper, substantially parallel to the reference direction, and which causes the objects arrange din an array to be moved; a discharging-promoting member which is provided in a vicinity of the end portion of the chute, which is movable substantially parallel to the reference direction, and which promotes discharging of the objects from the hopper to the chute while arranging the objects into the array; and a drive device which reciprocates, relative to the chute, the discharging-promoting member between an advanced position where an end portion of the discharging-promoting member projects into the hopper and a retracted position away from the advanced position. The entirety of the bottom surface of the hopper may be inclined relative to the horizontal plane. Otherwise, at least a portion of the other portion of the bottom surface than the inclined portion thereof may be vertical. That is, the bottom surface of the hopper may be a semi-funnelform one. The objects may be any articles, for example, electric components according to the twentieth feature (20) described later. Each of the objects may be any transverse cross section, such as a polygonal (e.g., quadrangular or triangular) transverse cross section, or a circular transverse cross section. The transverse cross section of the chute may be identical with, or different from, that of each object. The discharging-promoting member being positioned at the retracted position thereof may be completely retracted into the chute, or otherwise, may be partly remaining in the hopper so long as the amount of projection of the promoting member into the hopper is smaller when being positioned at the retracted position than when being positioned at the advanced position. The discharging-promoting member may be a member which provides, according to the fourth feature (4) described later, a portion of the hopper-side end portion of the chute that defines an object-supply passage therein, or a member which does not provide any portion of the hopper-side end portion of the chute and is provided at a location around the end portion and which is reciprocated between the advanced and retracted positions. The object stored in the hopper are moved toward the chute by the inclined portion of the bottom surface of the hopper. When the discharging-promoting member is moved to the advanced position, the objects present in the lowest portion of the hopper are moved and prevented from clogging the opening of the chute in the bottom surface or making a "bridge" over the opening. Thus, the discharging-promoting member promotes or helps the objects to enter the chute. Since the end portion of the chute extends substantially parallel to the reference direction in which the inclined portion of the bottom surface extends, the objects riding on the inclined portion slide and move toward the chute owing to the inclination of the inclined portion, and only the object whose transverse-cross-section phase is equal to that of the opening of the chute can directly enter the chute. Since the objects are guided toward the chute by the continuous inclined portion of the bottom surface of the hopper, the object can more easily enter the chute. Thus, the present arranging and supplying apparatus can more reliably or stably supply the objects. When the discharging-promoting member is moved to the retracted position, the objects present around that member are moved toward the chute to follow that member, and only the object whose transverse-cross-section phase is equal to that of the opening of the chute can enter the chute. According to the first feature (1), the end portion of the chute extends substantially parallel to the reference direction in which the inclined portion of the bottom surface extends, and the discharging-promoting member is movable substantially parallel to the reference direction. Therefore, the present arranging and supplying apparatus can reliably and stably supply the objects, without needing a complicated construction. In addition, since the end portion of the chute extends from the lowest portion of the hopper and each object moves from the lowest portion into the end portion, every object stored in the hopper can enter the chute. Thus, the present apparatus can supply all the objects to the last one.

(2) According to a second feature of the present invention that includes the first feature (1), the end portion of the chute has an opening which opens in the bottom surface of the hopper, and the discharging-promoting member and the portion of the bottom surface of the hopper are located on both sides of the opening of the chute, respectively. The discharging-promoting member is, preferably, a flat member according to the third feature (3), or a grooved member according to the fifth feature (5)), but is not limited to those members. That is, the discharging-promoting member may be provided by a different member having a different shape, such as a bar-like member. In addition, the discharging-promoting member may provide at least a portion of the end portion of the chute that is connected to the bottom surface of the hopper, or may be provided separately from the chute, e.g., at a position above the chute. In the present arranging and supplying apparatus, the discharging-promoting member moves the objects which ride on the objects which directly ride on the inclined portion of the bottom surface of the hopper, and the movement of the former objects causes the latter objects to move toward the chute, thereby promoting discharging of the latter objects into the chute. In the case where the discharging-promoting member is provided by a flat member or a bar member, a wide space continuous with the opening of the chute is left between that member and the inclined portion of the bottom surface of the hopper, when that member is advanced to the advanced position, so that the objects moved by the advancing of the member can easily move toward the chute.

(3) According to a third feature of the present invention that includes the first or second feature (1) or (2), the discharging-promoting member comprises a flat member which has an elongate cross section taken along a plane perpendicular to the reference direction. According to the third feature (3), the cross section of the flat member as the discharging-promoting member is considerably small and accordingly the flat member contacts a considerably small area of each object. Therefore, the drive device can reciprocate the flat member with a considerably small drive force.

(4) According to a fourth feature of the present invention that includes the third feature (3), the end portion of the chute has an object-supply passage in which the objects are moved, and the flat member extends parallel to a vertical plane and has a lower surface which is parallel to a horizontal direction and which provides a portion of the end portion of the chute and thereby partly defines the object-supply passage. Accordingly to the fourth feature (4), the portion of the end portion of the chute that is provided by the flat member is reciprocated by the drive device, and accordingly the objects present around the opening of the chute in the bottom surface of the hopper are directly moved by the flat member. Thus, the present apparatus can effectively promote discharging of the objects into the chute.

(5) According to a fifth feature of the present invention that includes any one of the first to fourth features (1) to (4), the end portion of the chute has an object-supply passage in which the objects are moved and which has a quadrangular transverse cross section, and the discharging-promoting member comprises a grooved member which has a groove opening in a side surface thereof on a side of the portion of the bottom surface of the hopper. In the case where each object has a quadrangular transverse cross section, the end portion of the chute preferably has a corresponding quadrangular cross section. However, the end portion of the chute may have a different transverse cross section, such as a circular or semicircular one. According to the fifth feature (5), three of four wall surfaces defining the object-supply passage of the end portion of the chute may be provided by the grooved member as the discharging-promoting member.

In the last case, when the grooved member is positioned at the advanced position, the opening of the groove of the grooved member is closed by the inclined portion of the bottom surface of the hopper, so that a passage having a quadrangular cross section is extended from the object-supply passage. This can be construed such that the chute is extended into the hopper. When the grooved member is advanced to the advanced position, the objects riding on the inclined portion of the bottom surface of the hopper are moved so that only the object whose transverse-cross-section phase coincides with that of the opening of the chute enters the chute through the extended passage defined by the grooved member and the inclined portion of the bottom surface of the hopper. When the grooved member is retracted to the retracted position, the objects are moved to follow the grooved member so that only the object that can enter the chute enters the chute.

(6) According to a sixth feature of the present invention that includes the fifth feature (5), the end portion of the grooved member has an end surface which is inclined such that as the end surface approaches a center of the object-supply passage, the end surface extends in a downstream direction of the object-supply passage. The objects are guided toward the chute by the inclination of the end surface of the grooved member. Thus, the present apparatus can reliably and stably promote the discharging of the objects into the chute.

(7) According to a seventh feature of the present invention that includes any one of the first to sixth features (1) to (6), the end portion of the chute has an object-supply passage in which the objects are moved and which has a quadrangular transverse cross-section, and the discharging-promoting member provides a portion of the end portion of the chute such that the discharging-promoting member cooperates with the chute to provide four wall surfaces which define the object-supply passage, and the discharging-promoting member is fitted in the chute such that irrespective of which position the discharging-promoting member takes relative to the chute, each of the four wall surfaces maintains continuity in the reference direction. When the discharging-promoting member is moved to the advanced position, a space extending in the reference direction is produced in rear of the promoting member. However, according to the seventh feature (7), that space can be one which does not allow each object to enter itself. Since the promoting member is fitted in the chute such that irrespective of which position the promoting member may take relative to the chute, each of the four wall surfaces maintains continuity in the reference direction, no space is produced between the promoting member and the chute in the reference direction. In addition, respective portions of the promoting member and the end portion of the chute that are fit in each other may have respective widths smaller than that of the entire wall surface defined by the fitted portions, and may be smaller than a corresponding dimension of each object. In this case, each object cannot enter the space produced between the promoting member and the chute. Thus, each object can be smoothly moved forward. The promoting member may be fitted in the hopper-side end portion of the chute such that when the promoting member is positioned at the advanced position, a rear portion of the promoting member overlaps a front portion of the end portion of the chute, or no overlapping portions of the two elements is left.

(8) According to an eighth feature of the present invention that includes any one of the first to seventh features (1) to (7), the end portion of the chute has an object-supply passage in which the objects are moved and which has a quadrangular transverse cross section, and the portion of the bottom surface of the hopper comprises an inclined bottom surface which is defined by a set of straight lines perpendicular to the reference direction, whose width in a widthwise direction perpendicular to the reference direction decreases as the inclined bottom surface approaches the end portion of the chute, and whose width is equal to a width of the object-supply passage at a position when the inclined bottom surface is connected to the end portion of the chute, and the bottom surface of the hopper further comprises two side-edge-defining surfaces which define opposite side edges of the inclined bottom surface, respectively. The inclined bottom surface may be a plane surface, or a curved surface. In the latter case, the angle of inclination of the curved surface with respect to the horizontal plane may increase as the surface approaches the opening of the chute. The two side-edge-defining surfaces may be inclined (either plane or curved) surfaces which cooperate with the inclined bottom surface to provide the bottom surface of the hopper, or vertical surfaces which vertically extend upward from the opposite side edges of the inclined bottom surface, respectively. In either case, the two side-edge-defining surfaces can guide the objects sliding on the inclined bottom surface and moving toward the chute, so that the objects reach the opening of the object-supply passage in the bottom surface of the hopper. Since the transverse cross section of the object-supply passage is quadrangular, at least a chute-side end portion of the hopper is defined by four surfaces including the inclined bottom surface and the two side-edge-defining surfaces. The last one surface may be either a vertical surface or an inclined (plane or curved) surface. In the last case, the inclined surface provides a portion of the bottom surface of the hopper, that is, another inclined bottom surface different from the above-indicated inclined bottom surface.

(9) According to a ninth feature of the present invention that includes any one of the first to eighth features (1) to (8), the drive device comprises a cam follower which is provided on the discharging-promoting member such that the cam follower is movable with the discharging-promoting member, and a pivotable cam which is pivotable about an axis line perpendicular to the reference direction and which engages the cam follower and converts an own pivotal motion into a linear motion of the cam follower. Since the drive device is provided by a cam follower and a pivotable cam, the amount, timing, frequency, etc. of movement of the discharging-promoting member can be easily defined by the shape of the pivotable cam, so that the promoting member promotes the discharging of the objects into the chute. As will be described later in DETAILED DESCRIPTION OF THE PREFERRED EMBODIMENTS, the present arranging and supplying apparatus may be employed by an electric-component ("EC") feeder. In this case, the pivotable cam of the drive device may be pivoted by a drive device of an EC mounting machine, in synchronism with a timing at which an EC is taken out from the EC feeder by an EC-suck head of the EC mounting machine. Thus, the promoting member is moved timely, quickly, and with minimum impact.

(10) According to a tenth feature of the present invention that includes the ninth feature (9), the cam follower comprises an engage pin which projects from the discharging-promoting member such that the engage pin extends in a direction perpendicular to the reference direction, and the pivotable cam comprises a cam lever which includes a recessed portion which engages the engage pin.

(11) According to an eleventh feature of the present invention that includes the ninth or tenth feature (9) or (10), the drive device comprises a driven member which is driven by a drive member which is driven by a drive source which is provided outside the apparatus. Since the drive member is provided outside the present arranging and supplying apparatus, the present apparatus need not employ the drive source to mechanically drive the driven member, nor any electric wiring for the drive source, which contributes to simplifying the construction of the present apparatus. In addition, the outside drive source and drive member can be used commonly with a plurality of arranging and supplying apparatuses, while one arranging and supplying apparatus is replaced with another. Moreover, in the case where a plurality of arranging and supplying apparatuses are simultaneously used, a plurality of outside drive members may be employed for driving the respective driven members of those apparatuses, or a single outside drive member may be employed for driving each of the respective driven members of those apparatuses. For example, in the case where the present arranging and supplying apparatus is employed in an EC feeder which supplies ECs to an EC mounting apparatus, a plurality of EC feeders are attached to a movable table, and respective EC-supply portions of the EC feeders are sequentially moved to an EC-supply position by the movement of the table, the outside drive member may be provided at the EC-supply position, and may be commonly used with the respective arranging and supplying apparatuses of the EC feeders. In this case, the cost can be significantly reduced. In addition, the outside drive device may be used with not only the present arranging and supplying apparatus but also a different apparatus. In the last case, the cost can be further reduced. The eleventh feature (11) can be employed by the arranging and supplying apparatus according to the first feature (1). That is, the outside drive device may be one which does not include a cam or a cam follower. Likewise, the motion converting device employed by the arranging and supplying apparatus according to the twelfth feature (12) may be one which does not include a cam or a cam follower.

(12) According to a twelfth feature of the present invention that includes the eleventh feature (11), the driven member comprises a reciprocateable member, and the drive device comprises a motion converting device which converts a single reciprocative movement of the reciprocateable member into a plurality of reciprocative movements of the discharging-promoting member. Since a single reciprocative movement of the reciprocateable member is converted into a plurality of reciprocative movements of the discharging-promoting member, the objects stored in the hopper are moved more frequently and are more effectively prevented from making a bridge. In addition, the respective postures and/or phases of the objects are more frequently changed, and the objects enjoy more chances to enter the chute. Thus, the objects can be supplied with higher reliability.

(13) According to a thirteenth feature of the present invention that includes the ninth or tenth feature (9) or (10), the arranging and supplying apparatus further comprises a drive source which drives the pivotable cam. In the case where a drive source is provided outside the present arranging and supplying apparatus and, in particular, a drive source of an external apparatus is used as the outside drive source of the present apparatus, the timing and/or frequency at which the drive member is driven by the outside drive source are limited depending upon the operation of the external apparatus. In contrast, according to the thirteenth feature (13), the arranging and supplying apparatus includes a drive source and accordingly the drive source can be used to operate the move device and thereby drive the driven member at an arbitrary timing and at an arbitrary frequency.

Thus, the objects can enter the chute with higher reliability. For example, in place of, or in addition to, a reciprocation of the discharging-promoting member at a timing at which an object is supplied, the promoting member may be reciprocated at least one time at at least one timing while the external apparatus waits for the supplying of the next object, so that another or other objects may enter the chute.

(14) According to a fourteenth feature of the present invention that includes the thirteenth feature (13), the drive source comprises an electric motor. The electric motor is preferably an electric rotary motor. In the case where the rotary motor is a servomotor or a stepper motor that is controllable with respect to its rotation angle or amount and its rotation direction, the operation of the pivotable cam can be easily controlled.

(15) According to a fifteenth feature of the present invention that includes the thirteenth or fourteenth feature (13) or (14), the drive device comprises a driving control device which operates, while the apparatus supplies each one object, the drive source by an amount which causes a plurality of reciprocative movements of the discharging-promoting member. For example, in the case where the pivotable cam is an eccentric cam and, when the eccentric cam is rotated by 360 degrees, the discharging-promoting member is reciprocated one time, the drive source is controlled such that while one object is supplied, the eccentric cam is fully rotated a plurality of times. Alternatively, in the case where the pivotable cam has a plurality of projections on its cam surface and, when the cam is rotated by 360 degrees, the promoting member is reciprocated a plurality of times, the drive source may be controlled to rotate the cam by only an angle smaller than 360 degrees. According to the fifteenth feature (15), since the promoting member is reciprocating plural times while each one object is supplied, the present apparatus is more effectively prevented from failing to supply each object. As explained above in connection with the twelfth feature (12), the higher the frequency of movement of the discharging-promoting member is, the more chances the objects can enjoy to enter the chute, so that a plurality of objects may enter the chute while one object is supplied. After the chute is filled with the objects, no more objects can enter the chute even if the promoting member is moved. This, however, is not problematic. Thus, the present apparatus can more reliably supply the objects.

(16) According to a sixteenth feature of the present invention that includes any one of the first to fifteenth features (1) to (15), the arranging and supplying apparatus further comprises an object-supply portion from which the apparatus supplies the objects one by one, and a feeding device which feeds the objects arranged in the array in the chute, to the object-supply portion. Since the present apparatus employs the feeding device, the apparatus can reliably feed the objects arranged in the array in the chute, to the object-supply portion. However, it is possible to move the objects to the object-supply portion, without employing a feeding device. For example, the entirety of the chute is inclined and, owing to the inclination of the chute, the objects are moved from the hopper-side opening of the chute to the object-supply portion.

(17) According to a seventeenth feature of the present invention that includes the sixteenth feature (16), the feeding device comprises an air-flow producing device which generates, in the chute, an air flow in a direction from the hopper toward the object-supply portion.

(18) According to an eighteenth feature of the present invention that includes the seventeenth feature (17), the air-flow producing device comprises a negative-pressure producing device which is connected to the object-supply portion and which sucks an air in the chute and thereby generates the air flow in the direction from the hopper toward the object-supply portion so that the objects in the chute are fed toward the object-supply portion.

(19) According to a nineteenth feature of the present invention that includes the sixteenth feature (16), the feeding device comprises an endless annular belt and a belt drive device which circulates the belt, and the chute includes, in addition to the end portion thereof as a first end portion on a side of the hopper, a second end portion which is opposite to the first end portion and which opens in a vicinity of an upper surface of an upper portion of the endless belt. This feeding device can be called as a "belt-type" feeding device and may be provided by the belt-type feeding device disclosed in Japanese Patent Application laid open upon Publication No. 11(1999)-20933 and corresponding to U.S. patent application No. 09/106,703 assigned to the assignee of the present application.

(20) According to a twentieth feature of the present invention that includes any one of the first to nineteenth features (1) to (19), each of the objects is an electric component which has a generally rectangular-parallelopiped shape. The present arranging and supplying apparatus may be employed in an EC feeder which supplies ECs. The EC feeder may be used for supplying ECs to an EC mounting device which mounts the ECs on a circuit board such as a printed-wiring board. However, the present apparatus may be employed in an EC feeder other than the EC feeder for supplying the ECs to the EC mounting device, for example, an EC feeder for supplying ECs to an EC transferring apparatus which holds and transfers ECs.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Hereinafter, preferred embodiments of the present invention will be described in detail by reference to the drawings.

Figure 1:
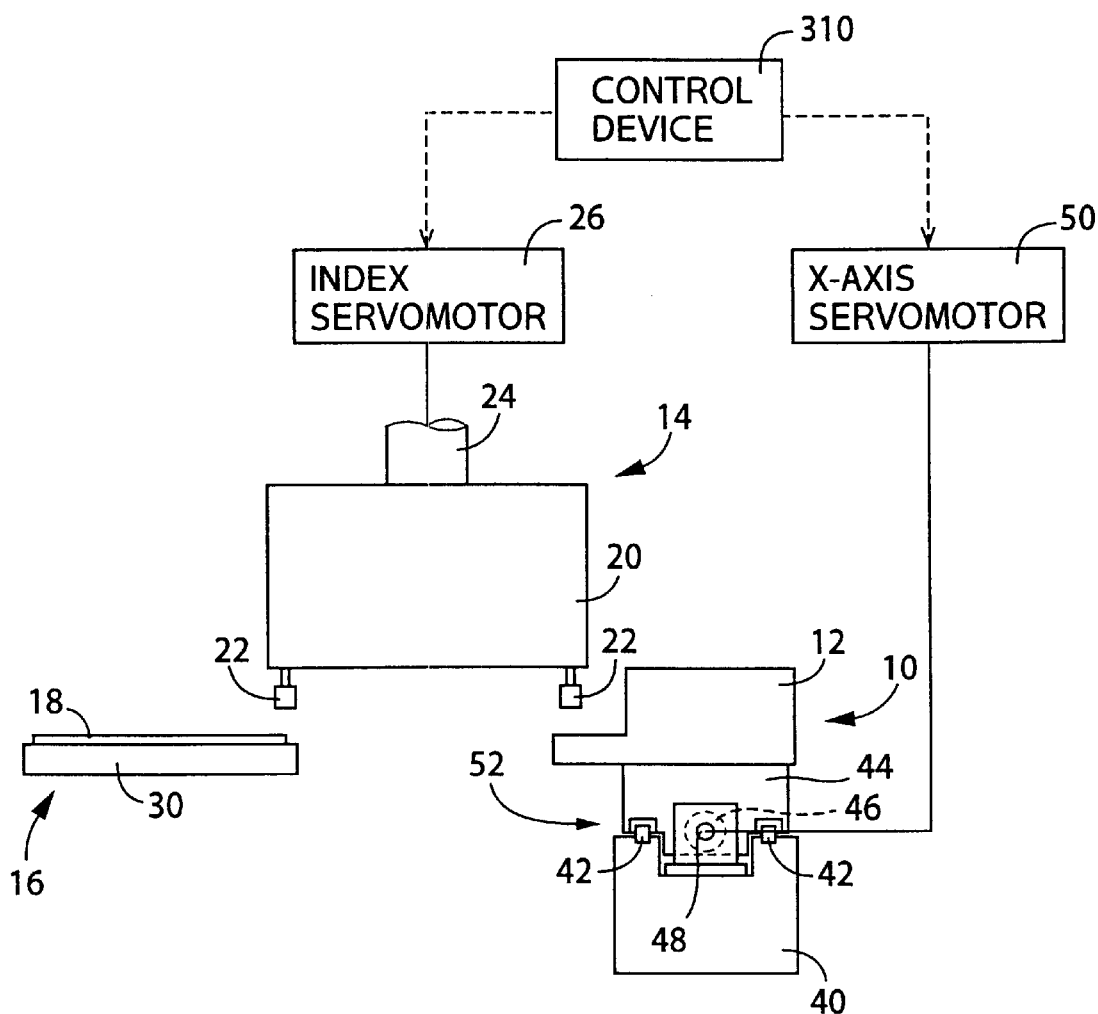
FIG. 1 is a schematic front elevation view of an an electric-component ("EC") mounting machine including an EC supplying system including an EC feeder which includes an EC arranging and supplying apparatus to which the present invention is applied.

FIG. 1, reference numeral 10 designates an electric-component ("EC") supplying system which includes a plurality of EC feeders 12 (only one EC feeder 12 is shown in FIG. 1). Each of the EC feeders 12 supplies electric components ("ECs") to an EC mounting system 14 as a sort of EC taking-out system. The EC mounting system 14 mounts the ECs on a printed-wiring board ("PWB") 18 which is positioned and supported by a PWB positioning and supporting system 16. The EC supplying system 10, the EC mounting system 14, and the PWB positioning and supporting system 16 cooperate with one another to provide an EC mounting machine.

The EC mounting system 14 includes an index table 20 as a rotatable member that is intermittently rotatable about a vertical axis line. The index table 20 has a plurality of (e.g., twelve) EC-suck heads 22 each as an EC holder (only two EC-suck heads 22 are shown in FIG. 1), and is intermittently rotated by an intermittently rotating device which is provided by a cam and a cam follower (both not shown), a rotary shaft 24, an index servomotor 26 which rotates the cam, etc., so that the twelve EC-suck heads 22 are sequentially moved to, and stopped at, an EC-suck position, an EC-posture-detect position, an EC-posture-correct position, an EC-mount position, etc. The EC-suck heads 22 are supported by the index table 20, such that each of the heads 22 can be vertically elevated and lowered, and two elevating and lowering devices (not shown) each of which elevates and lowers each EC-suck head 22 are provided at the EC-suck position and the EC-mount position, respectively. The rotation of the index servomotor 26 is converted by a motion converting device which is provided by a cam and a cam follower (not shown), etc., into upward and downward movement of an elevator member (not shown), which causes each EC-suck head 22 to be elevated and lowered.

The PWB positioning and supporting system 16 includes a PWB-support table 30 which positions and supports the PWB 18. The PWB-support table 30 is provided on an X-Y table (not shown) which is movable in an X-axis direction (i.e., a direction perpendicular to the sheet of FIG. 1) and a Y-axis direction (a widthwise direction of the sheet of FIG. 1) which are perpendicular to each other on a horizontal plane. Thus, owing to the movement of the X-Y table, the PWB 18 is movable to an arbitrary position on the horizontal plane. The PWB 18 is conveyed, and carried in onto the PWB-support table 30, by a carry-in conveyor (not shown), and is carried out off the PWB-support table 30, not conveyed, by a carry-out conveyor (not shown), all in a direction parallel to the X-axis direction. When ECs are mounted on the PWB 18, the PWB 18 is moved by the X-Y table, so that each of prescribed EC-mount locations on the PWB 18 is positioned right below the EC-suck head 22 being positioned at the EC-mount position and the EC held by the EC-suck head 22 is mounted at the each EC-mount location on the PWB 18.

Next, the EC supplying system 10 will be described.

The EC supplying system 10 includes a base 40 on which a pair of guide rails 42 each as a guide member are provided to extend parallel to the X-axis direction and provide a guide device. An X-axis table 44 as a sort of movable table fits on the guide rails 42, such that the X-axis table 44 is movable in the X-axis direction. On the X-axis table 44, the above-indicated plurality of EC feeders 12 are provided such that respective EC-supply portions of the EC feeders 12 are arranged along a reference line (in the present embodiment, a straight line parallel to the X-axis direction) and each of the EC feeders 12 feeds ECs in an EC-feed direction thereof parallel to the Y-axis direction. The EC-supply portion of each EC feeder 12 is a portion thereof from which ECs are supplied to the EC mounting system 14, and can also be said as an EC-take-out portion thereof from which the ECs are taken out by the EC mounting system 14.

A nut 46 is fixed to the X-axis table 44, and is threadedly engaged with a feed screw 48 which is provided on the base 40 such that the feed screw 48 is not movable relative to the base 40 in an axial direction of the screw 48 and is rotatable relative to the base 40 about an axis line of the screw 48 parallel to the X-axis direction. When the feed screw 48 is rotated about its axis line by an X-axis servomotor 50, the X-axis table 44 is moved in the X-axis direction, so that the EC-supply portion of each of the EC feeders 12 is selectively positioned at a predetermined EC-supply position right below the EC-suck head 22 being positioned at the EC-mount position. The nut 46, the feed screw 48, and the X-axis servomotor 50 cooperate with one another to provide a table moving device 52. Each of the X-axis servomotor 50 and the above-mentioned index servomotor 26 is an electric motor as a sort of drive source that is accurately controllable with respect to rotation angle and rotation speed, and may be replaced with a stepper motor.

Next, each EC feeder 12 will be described.

Figure 2:
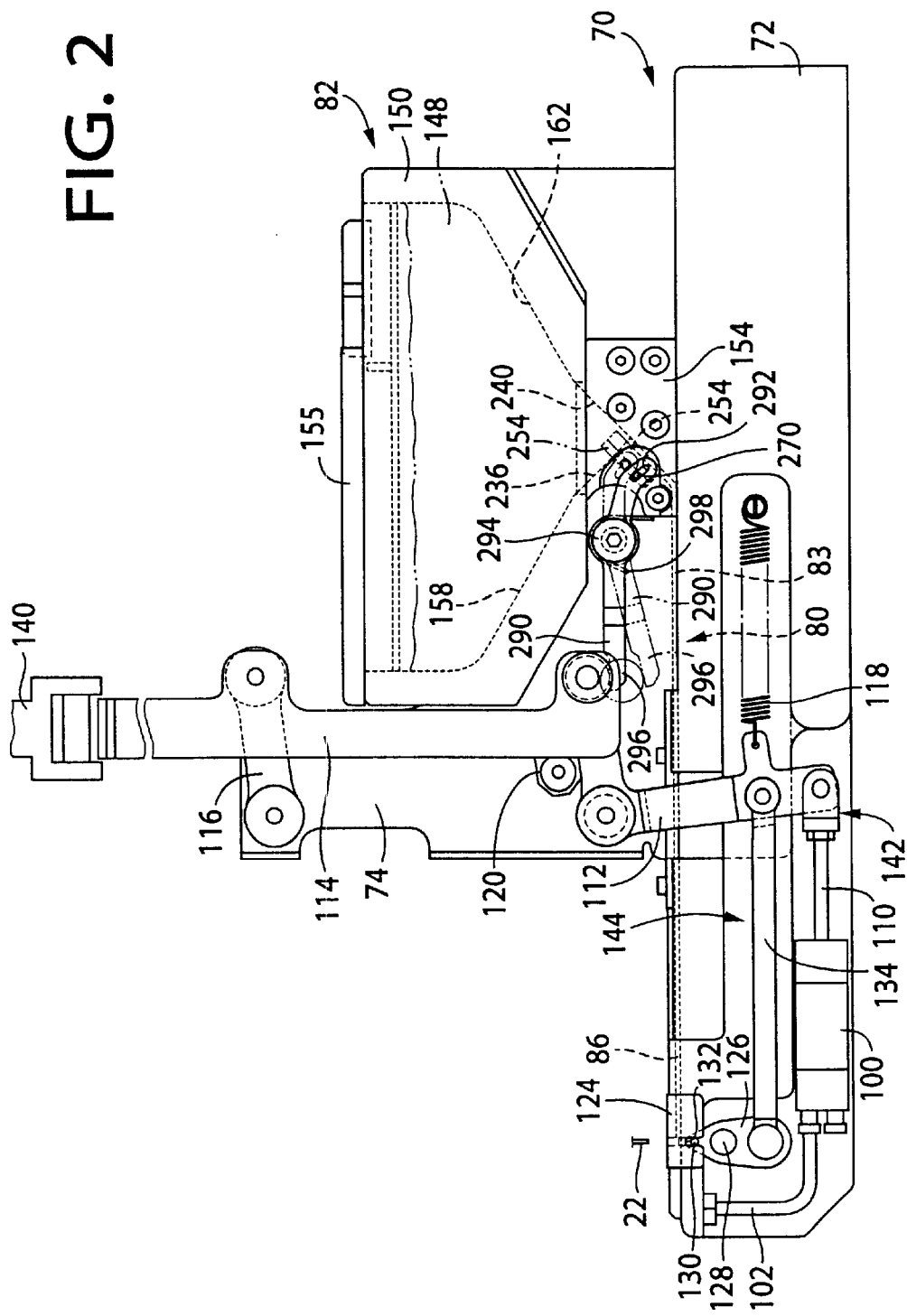
FIG. 2 is a front elevation view of the EC feeder.

As shown in FIG. 2, each EC feeder 12 includes a main frame 70 which is obtained by assembling, for easier production, a plurality of members including a first member 72, a second member 74, etc. The first and second members 72, 74 and other members that have been assembled with one another function as the integral main frame 70. The first member 72 has a generally elongate, plate-like shape. A lengthwise direction of the first member 72 is parallel to the Y-axis direction, and a widthwise direction of the same 72 that is perpendicular to both the EC-feed direction and a vertical direction is parallel to the X-axis direction. The plurality of EC females 12 take respective upright postures on the X-axis table 44, such that as described previously the respective EC-supply portions of the EC feeders 12 are arranged along one straight line parallel to the X-axis direction. The first member 72 is positioned, by a positioning device (not shown), relative to the X-axis table 44, in the lengthwise and widthwise directions of the first member 72, and is attached, by an engaging device (not shown), to the table 44 such that the first member 72 cannot move up off the table 44. The EC feeder 12 can be removed or detached from the X-axis table 44, by disengaging the engaging device from the table 44 and thereby releasing the first member 72 from the same 44.

A chute 80 is provided on the main frame 70. The chute 80 starts at a rear portion of the main frame 70, i.e., a portion thereof which is remote from the EC mounting system 14 in the state in which the EC feeder 12 is attached to the X-axis table 44, and to which a hopper 82 is detachably attached, and ends at a front portion of the main frame 70 which is near to the EC mounting system 14. Thus, the chute 80 extends parallel to the lengthwise direction (i.e., front-rear direction) of the EC feeder 12. The chute 80 has a tubular shape which is open at only opposite ends thereof and which has an EC-supply or EC-feed passage 83 having a rectangular transverse cross section.

The hopper 82 accommodates, in bulk, a number of "leadless" ECs 84 each of which has no lead wires and has a generally rectangular-parallelopiped shape. Each leadless EC 84 is a sort of EC as an object to be supplied. Thus, each leadless EC 84 is a short prismatic object which has a rectangular transverse cross section. The rectangular transverse cross section of the feed passage 83 corresponds to that of each EC 84. The rectangle as the transverse cross section of the passage 83 has such dimensions which permit each EC 84 to move through the passage 83 but do not permit the same 84 to change its posture or phase in the passage 83.

Each of the ECs 84 stored in the hopper 82 is moved to the front portion of the main frame 70 through the feed passage 83 of the chute 80. One end portions of the chute 80 located on the side of the hopper 82 is an initial end portion of the same 80, and the other end portion of the same 80 located on the front portion of the main frame 70 is a terminal end portion of the same 80. The terminal end portion of the chute 80 provides a horizontal portion 86 which horizontally extends parallel to the lengthwise direction of the main frame 70 and which has, at its terminal end, an EC-take-out aperture 88 (FIG. 3) which opens upward. The EC-take-out aperture 88 is formed at a position on the main frame 70 that is positioned, when the EC feeder 12 is positioned at the EC-supply position, right below the EC-suck head 22 being positioned at the EC-suck position.

Figure 3:
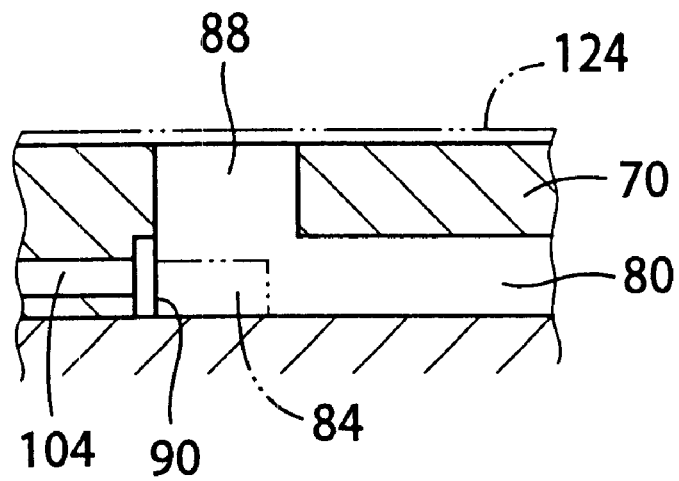
FIG. 3 is a cross-sectional front elevation view of a terminal-end portion of a chute as an element of the EC arranging and supplying apparatus.

Each of the ECs 84 moved through the chute 80 is brought into contact with an end surface 90 which extends perpendicularly to a lengthwise direction of the chute 80 and defines the terminal end of the same 80, and accordingly is stopped by the end surface 90. As shown in FIG. 3, the end surface 90 is flush with one of two side wall surfaces of the EC-take-out aperture 88 that are opposed to each other in the EC-feed direction, the one surface being a downstream-side surface as seen in the direction of movement of each EC 84 in the terminal end portion of the chute 80. Therefore, each EC 84 held in contact with the end surface 90 is positioned within the EC-take-out aperture 88. The EC-take-out portion of each EC feeder 12, i.e., the EC-supply portion thereof which supplies the ECs 84, includes the EC-take-out aperture 88. Thus, the end surface 90 provides a stopper, or a positioning device which positions, in the EC-supply portion, the ECs 84, one by one, which have been moved in an array through the chute 80.

Figure 4:
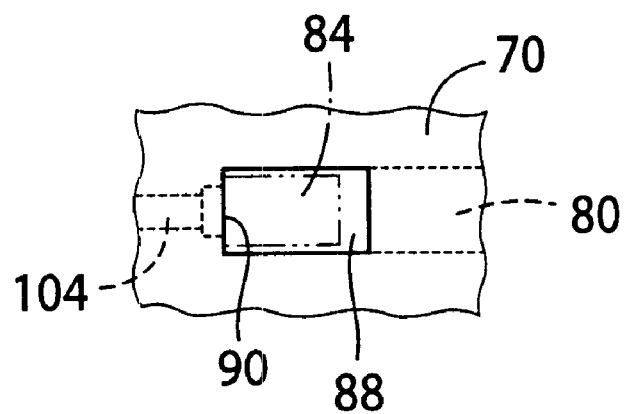
FIG. 4 is a plan view of the terminal-end portion of the chute.

Air in the chute 80 is sucked by a plunger pump 100 as a reciprocating pump, so that air flows in the chute 80. As shown in FIGS. 2 and 3, a suction inlet of the plunger pump 100 is connected to the chute 80 via a hose 102 as a connecting member, and a suction passage 104 formed in the main frame 70. As shown in FIGS. 3 and 4, the suction passage 104 has, in the end surface 90, an opening whose width is smaller than a width of each EC 84 and whose length is greater than a thickness or height of the same 84. Thus, the suction inlet of the plunger pump 100 is connected to the terminal end of the chute 80. A discharge outlet of the pump 100 is communicated with the atmosphere. The suction inlet and discharge outlet of the pump 100 are provided with a suction valve and a discharge valve (both not shown), respectively.

As shown in FIG. 2, the plunger pump 100 has a rod 110 which is pivotally connected to one end portion of a drive lever 112 as a drive member that is attached to the main frame 70 such that the drive lever 112 is pivotable about an axis line parallel to the widthwise direction of the EC feeder 12. To the other end portion of the drive lever 112, a lower end portion of an elevator link 114 as a driven member is pivotally connected. An upper portion of the elevator link 114 is pivotally connected to a link 116 which is pivotally attached to the main frame 70. Thus, the elevator link 114 is attached to the main frame 70, such that the elevator link 114 is movable (in the present embodiment, movable up and down) relative to the main frame 70. The elevator link 114 provides a reciprocating member which reciprocates relative to the main frame 70. The drive lever 112 is biased, by a tension coil spring 118 as a sort of elastic member as a sort of biasing device, in a direction in which the elevator link 114 is moved upward. The pivotal movement of the drive lever 112 caused by the biasing action of the spring 118 is limited or stopped by butting of the lever 112 against a stopper 120 provided on the main frame 70. A position of the elevator link 114 when the drive lever 112 butts on the stopper 120 is an upper-dead position as a first position of the elevator link 114, and the spring 118 maintains the elevator link 114 at its upper-dead portion.

The mainframe 70 is provided with a shutter 124 which covers the EC-take-out aperture 88. The shutter 124 fits on the main frame 70, such that the shutter 124 is movable parallel to the lengthwise direction of the main frame 70 and the horizontal portion 86 of the chute 80, and such that the shutter 124 is movable to an operative position where the shutter 124 covers the aperture 88 and to an inoperative position where the shutter 124 opens the aperture 88. A drive plate 126 as a drive member is attached to the main frame 70 via an axis member 12H, such that the drive plate 126 is pivotable about an axis line parallel to the widthwise direction of the EC feeder 12. The drive plate 126 includes a projection 130 which fits in a recess 132 formed in the shutter 124. One end portions of a link 134 is pivotally connected to the drive plate 126, and the other end portion of the link 134 is pivotally connected to the drive lever 112.

The elevator link 114 is driven by an elevator member 140 as a drive member that is provided at the EC-supply position. The elevator member 140 is provided at a position above the elevator link 114 of the EC feeder 12 whose EC-supply portion is positioned at the EC-supply position. Thus, the elevator member 140 is provided outside each EC feeder 12. The rotation of the index servomotor 26 as a drive source provided outside each EC feeder 12 is converted, by a motion converting device which is provided by a cam and a cam follower (not shown), etc., into the upward and downward movement of the elevator member 140. Thus, the elevator member 140 is moved upward and downward in relation with the upward and downward movement of each EC-suck head 22 to take out the EC 84 from the EC feeder 12.

When each EC-suck head 22 is moved downward to take out the EC 84 from the EC feeder 12, the elevator member 140 is moved downward concurrently with the downward movement of the EC-suck head 22, and engages the elevator link 114, thereby moving the same 114 downward. The downward movement of the elevator link 114 is allowed since the drive lever 112 is pivoted against the biasing force of the spring 118 and the spring 118 is extended. Thus, the elevator link 114 is moved from its upper-dead position to its lower-dead position as its second position. The lower-dead position of the elevator link 114 is defined by a lower-dead position of the elevator member 140. When the drive lever 112 is pivoted against the biasing action of the spring 118, the rod 110 is advanced, so that the discharge valve of the plunger pump 100 is opened and the air is discharged from the pump 100. In addition, the link 134 is moved and the drive plate 126 is pivoted in a backward direction (clockwise in FIG. 2), so that the shutter 124 is moved to its inoperative position to open the EC-take-out aperture 88. Thus, the shutter 124 allows the EC-suck head 22 to take out the EC 84.

After the EC-suck head 22 sucks the EC 84 and is elevated to take out the EC 84 from the EC feed 12, the elevator member 140 is elevated, and the elevator link 114 follows the elevator member 114 owing to the rotation of the drive lever 112 caused by the biasing action of the spring 118. Accordingly, the rod 110 is moved backward, the suction valve of the plunger pump 100 is opened to suck the air in the chute 80, and the drive plate 126 is pivoted in a forward direction (counterclockwise in FIG. 2), so that the shutter 124 is moved forward to its operation position to cover the EC-take-out aperture 88. The suction valve of the plunger pump 100 is designed such that after the rod 110 starts moving backward, the suction valve is opened to suck the air. Thus, when the shutter 124 covers the EC-take-out aperture 88, the air in the chute 80 is sucked, and the air flows in a direction from the hopper 82 toward the aperture 88. Therefore, the ECs 84 present in the chute 80 are moved toward the terminal end of the chute 80, i.e., the EC-supply portion of the EC feeder 12, so that the leading EC 84 butts on, and is stopped by, the end surface 90, and is positioned in the aperture 88. The suction valve of the plunger pump 100 is closed at a timing around the time when the rod 110 is stopped. In the present embodiment, the plunger pump 100 provides a negative-pressure producing device as a sort of air-flow producing device as a sort of EC feeding device; and the drive lever 112 which is provided between the elevator link 114 and the plunger pump 100, provides a plunger-pump drive device 142 as a sort of negative-pressure-producing-device drive device that drives, owing to the movement of the elevator link 114 between its upper-dean and lower-dead positions, the plunger pump 100 as the negative-pressure producing device. The drive lever 112, the drive plate 126, and the link 134 which are provided between the elevator link 114 and the shutter 124, cooperate with one another to provide a shutter drive device 144 which converts the movement of the elevator link 114 between its upper-dead and lower-dead positions, into the movement of the shutter 124 between its operative and inoperative positions.

Figure 5:
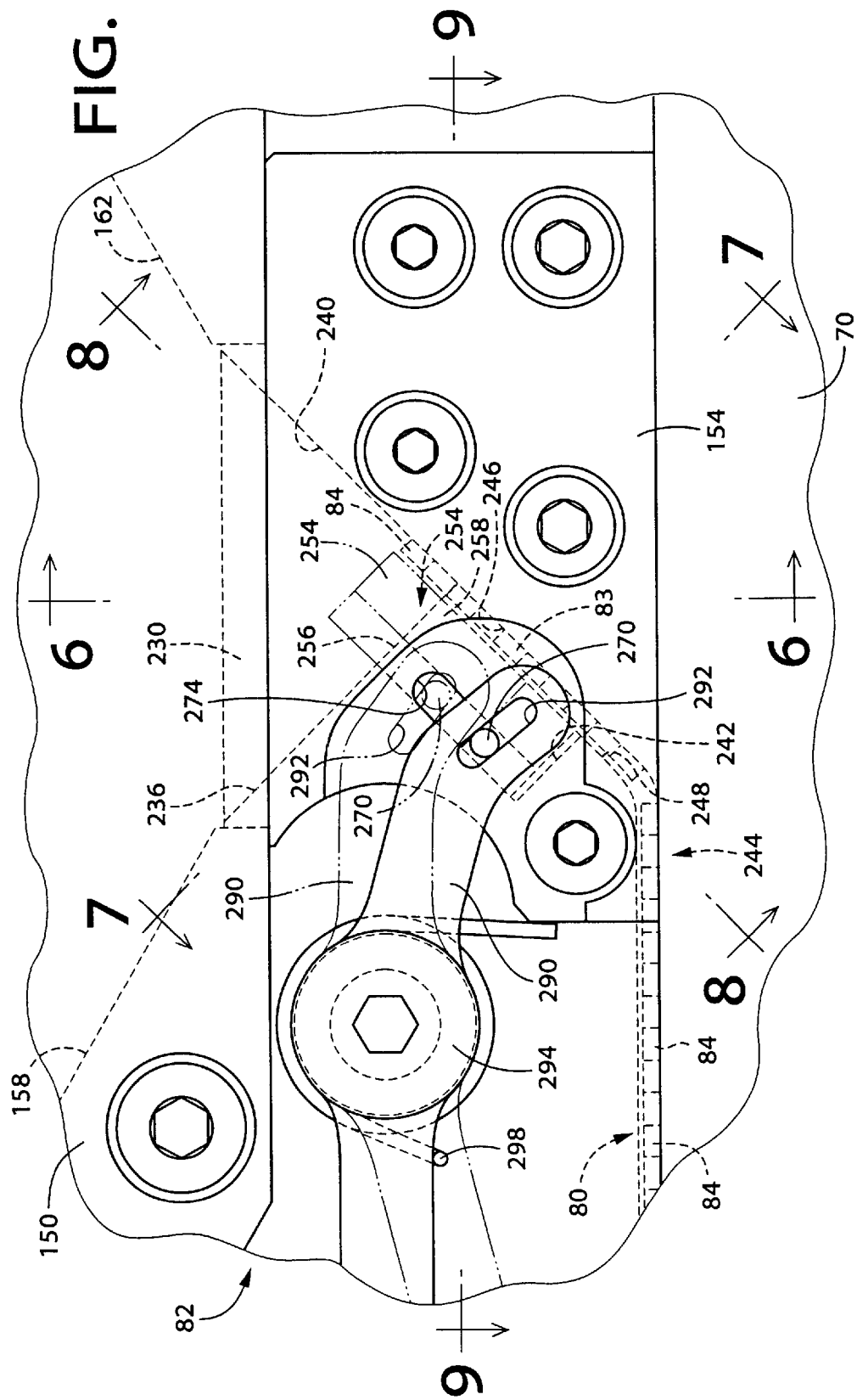
FIG. 5 is a front elevation view of an initial-end portion of the chute, and a hopper as another element of the EC arranging and supplying apparatus.
Figure 6:
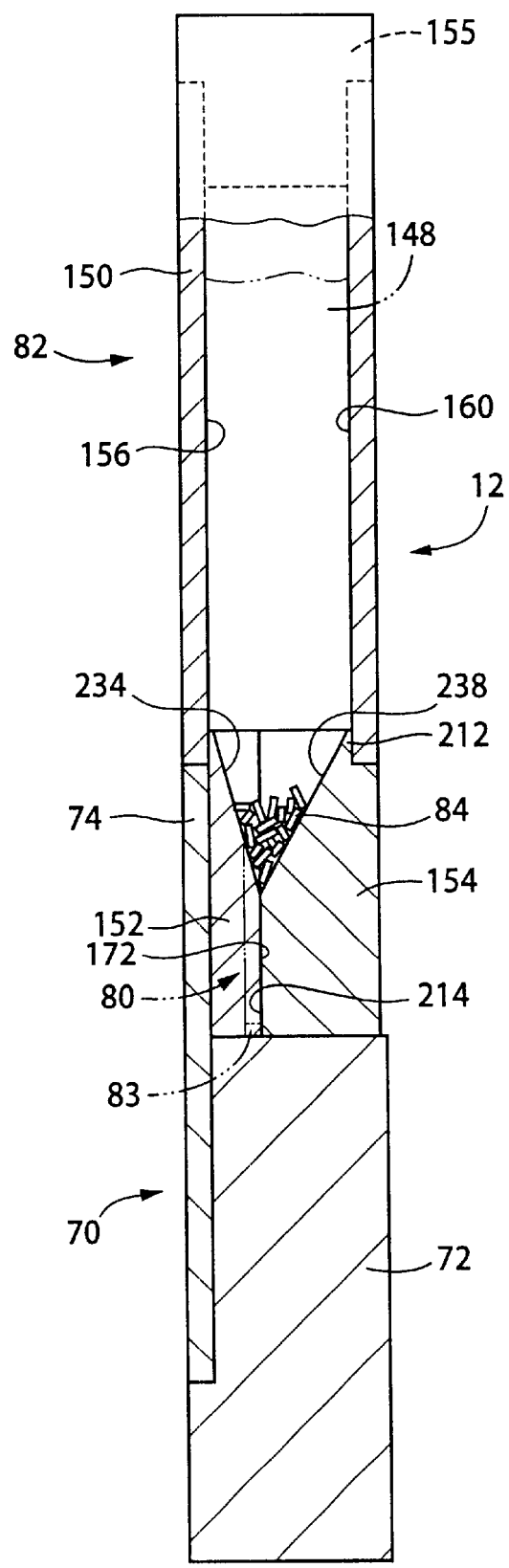
FIG. 6 is a cross-sectional side elevation view taken along plane 6—6 in FIG. 5.

As shown in FIG. 6, the hopper 82 are obtained by assembling a first member 150, a second member 152, and a third member 154, and the first, second, and third members 150, 152, 154 that have been assembled with one another function as the integral hopper 82. The hopper 82 accommodates a number of ECs 84 therein. The ECs 84 are accumulated in the hopper 82 such that each EC 84 takes an arbitrary posture, and the ECs 84 accumulated in the hopper 82 provide a EC layer 148. The first member 150 is a frame-like member which has a rectangular cross section taken along a horizontal plane, and a lengthwise direction of the first member 150 is parallel to the lengthwise direction of the EC feeder 12. An upper opening of the first member 150 is covered by a lid member 155 having a shutter which can be opened and closed. The first member 150 has four inner side surfaces 156, 158, 160, 162, and the two surfaces 156, 160 that are distant from each other in the widthwise direction of the first member 150 are vertical. The other two surfaces 158, 162 that are distant from each other in the lengthwise direction of the first member 150 have respective lower portions which are inclined toward each other as those two surfaces extend downward, as shown in FIG. 5. The respective inclined lower portions of the two surfaces 158, 162 have a same inclination angle with respect to a horizontal plane, and cooperate with each other to contain or define an obtuse angle therebetween.

Figure 7:
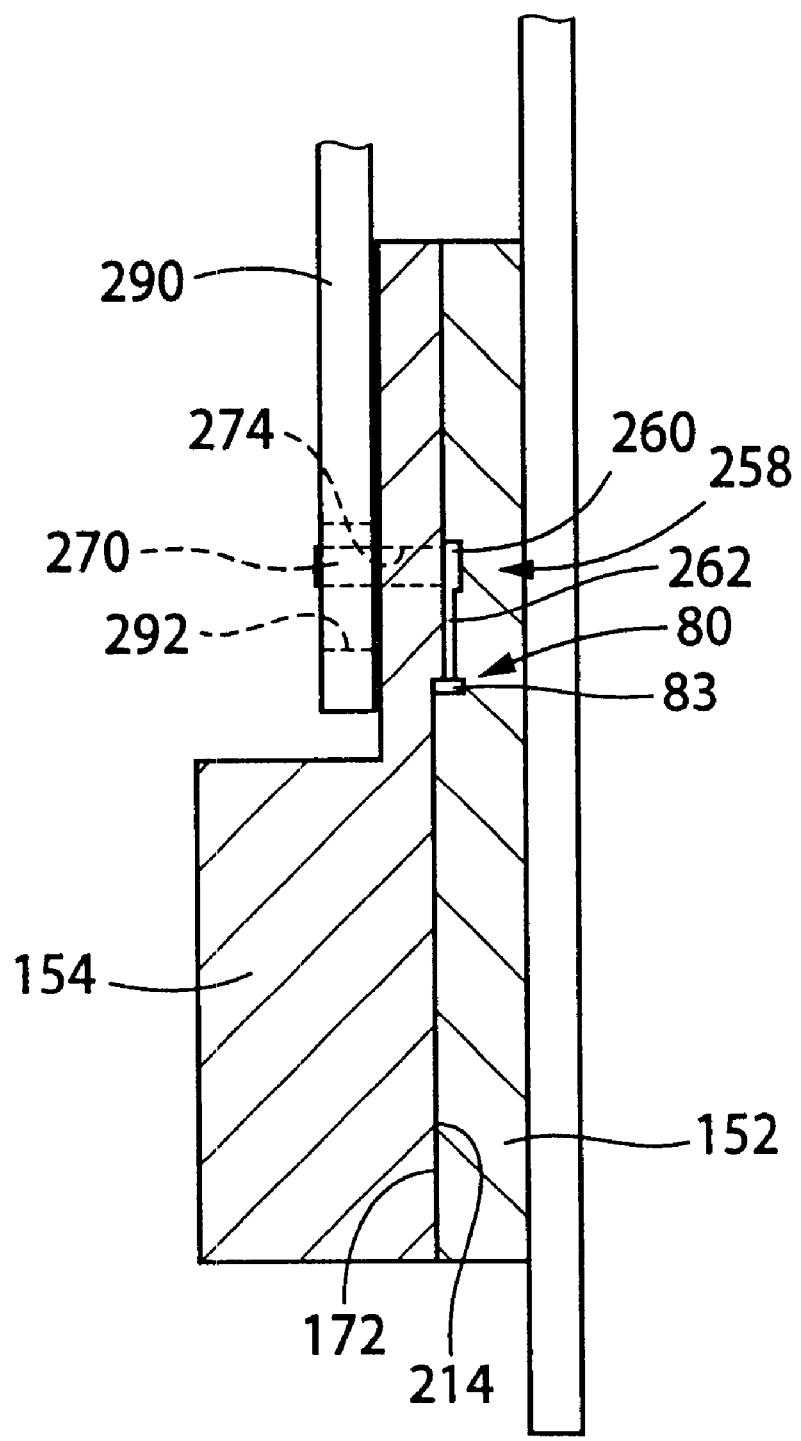
FIG. 7 is a cross-sectioned view taken along plane 7—7 in FIG. 5.
Figure 10:
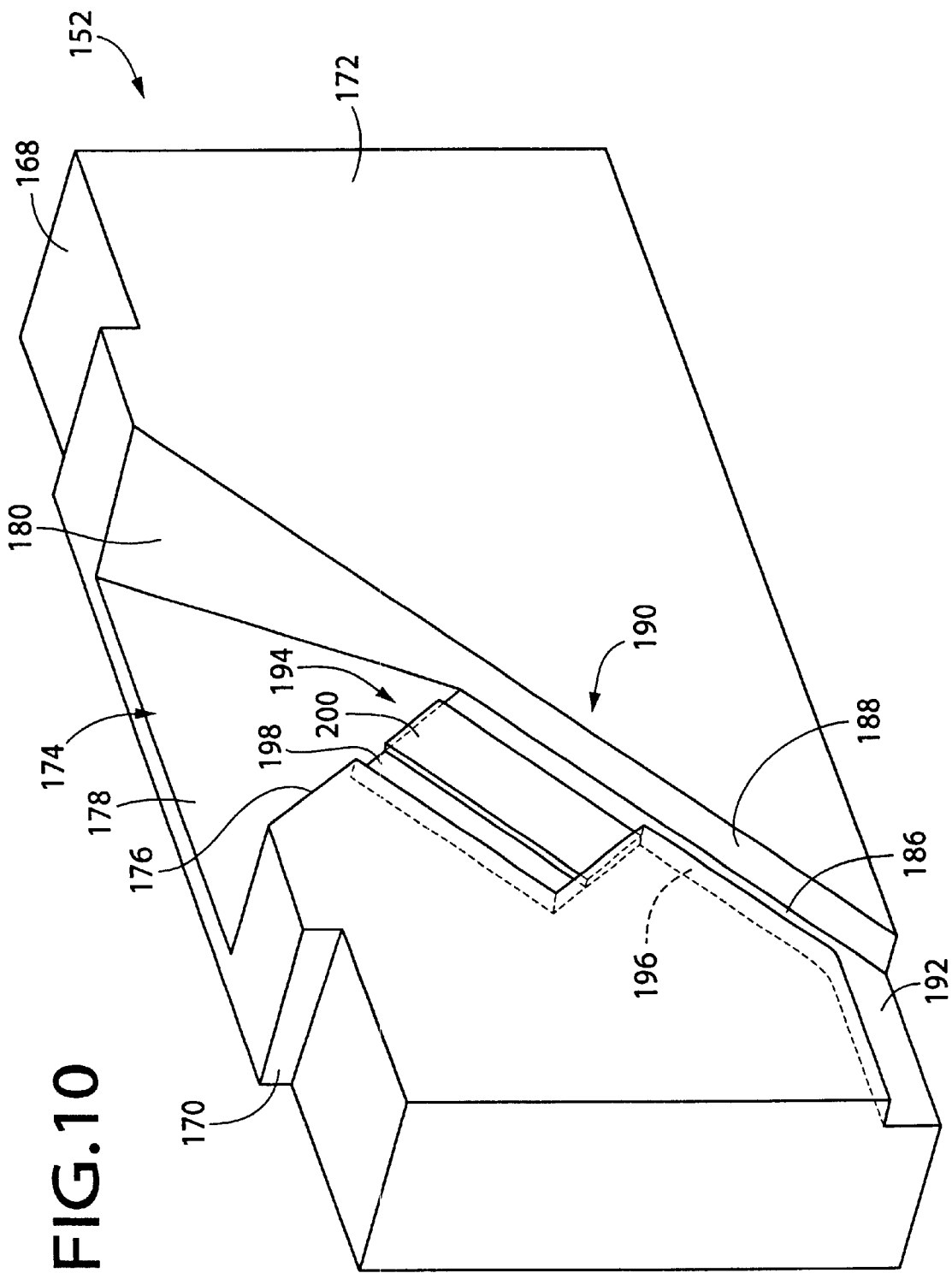
FIG. 10 is a perspective view of a second member of the hopper.

The second and third members 152, 154 are assembled with a lower end of the first member 150. As shown in FIGS. 6 and 7, the second member 152 has a block-like shape having a rectangular transverse cross section. As shown in FIG. 10, the second member 152 includes a projecting portion 170 which projects upward from a lengthwise intermediate portion of an upper surface 168 of the member 152. The second member 152 has a recess 174 which opens in an upper surface of the projecting portion 170 and a side surface 172 of the member 152 that is assembled with the third member 154. The recess 174 has a rectangular cross section taken along a horizontal plane. The recess 174 is defined by three plane surfaces 176, 178, 180 which are inclined toward one another as those surfaces 176, 178, 180 extend downward. Respective angles of the inclination of the two surfaces 176, 180 with respect to a horizontal plane are greater than those of the respective inclined lower portions of the side surfaces 158, 162 of the first member 150, and are equal to 45 degrees in the present embodiment. Thus, the two surfaces 176, 180 cooperate with each other to contain or define a rectangle, i.e., 90 degrees therebetween.

As shown in FIG. 10, the second member 152 has a chute-forming groove 186 which opens in the side surface 172 and has a depth (i.e., width) smaller than the long sides of the rectangle as the transverse cross section of each EC 84. The grooves 186 also opens in the first recess-forming surface 176, and is inclined such that the groove 186 extends parallel to the third recess-forming surface 180, i.e., perpendicularly to the first surface 176. The groove 186 includes an inclined portion 190 whose bottom surface 188 is flush with the third surface 180, and a horizontal portion 192 which extends horizontally.

The second member 152 additionally has a plate-fit recess 194 as a discharging-promoting-member-fit process. The plate-fit recess 194 opens in the side surface 172, the first recess-forming surface 176, and a top surface 196 of the chute-forming groove 186, and extends parallel to the inclined portion 190 of the groove 186. The plate-fit recess 194 is provided above the inclined portion 190, and defines a generally rectangular-parallelopiped space whose height, i.e., dimension in a direction perpendicular to both lengthwise and depthwise directions of the inclined portion 190, is greater than a depth thereof, i.e., dimension in a direction parallel to the depthwise direction of the portion 190. Thus, the plate-fit recess 194 is opposite to the third surface 180 with respect to an opening of the chute-forming groove 186 in the recess 174. The recess 194 extends parallel to the third surface 180, and the depthwise direction of the recess 194 is horizontal.

More specifically described, the plate-fit recess 194 defines a stepped space including a first portion remote from the top surface 196 of the groove 186, and a second portion near to the groove 186 and shallower than the first portion. As described later, the plate-fit recess 194 provides a discharging-promoting-member-fit hole, and the depth of the recess 194 can be called as the width of the hole. Therefore, hereinafter, the above-indicated first portion of the recess 194 is referred to as the wide portion 198, and the second portion of the same 194 is referred to as the narrow portion 200. The width of the wide portion 198 is equal to that of the top surface 196 of the groove 186, and equal to the depth of a portion of the groove 186 that is defined by the surface 196.

The third recess-forming surface 180 and the bottom surface 188 of the chute-forming groove 186 project horizontally from the top surface 196 of the groove 186. That is, a portion of the side surface 172 that is located on a right-hand side of the third surface 180 and the bottom surface 188, as seen in FIG. 10, projects frontward from a portion of the side surface 172 that is located on a left-hand side of the top surface 196 of the groove 186. The width of the bottom surface 188 is slightly greater than the long sides of the rectangle as the transverse cross section of each EC 84. Thus, the width of the top surface 196 is smaller than that of the bottom surface 188. That is, the depth of the groove 186 is smaller, with respect to a portion thereof defined by the top surface 196, than the long sides of the rectangle as the transverse cross section of each EC 84, and is greater, with respect to a portion thereof defined by the bottom surface 188, than the long sides of the rectangle.

Figure 11:
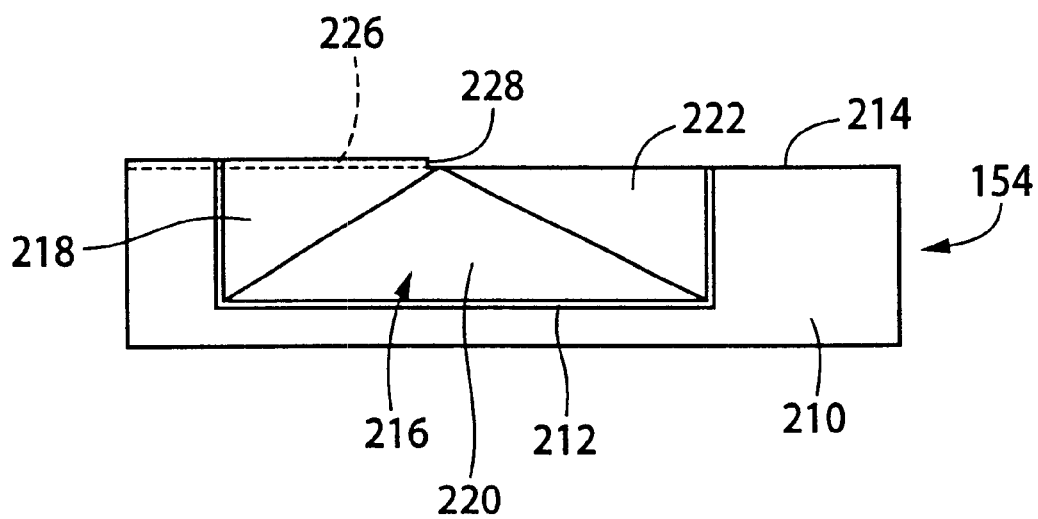
FIG. 11 is a plan view of a third member of the hopper.

The third member 154 has, as shown in FIGS. 7 and 11, has a block-like shape and, as shown in FIGS. 6 and 11, includes a projecting portion 212 which projects upward from a lengthwise intermediate portion of an upper surface 210 of the member 154. The width of the projecting portion 212 is smaller than that of the third member 154. The third member 154 has a recess 216 which opens in an upper surface of the projecting portion 212 and a side surface of the member 154 that is assembled with the second member 152. The recess 216 has a rectangular cross section taken along a horizontal plane. The recess 216 is defined by three plane surfaces 218, 220, 222 which are inclined toward one another as those surfaces 218, 220, 222 extend downward. Respective angles of inclination of the two surfaces 218, 222 distant from each other in the lengthwise direction of the third member 154, with respect to a horizontal plane, are equal to those of the first and third recess-forming surfaces 176, 180 of the second member 152. The angle of inclination of the surface 220 is prescribed such that the surface 220 cooperates with the second recess-forming surface 178 of the second member 152 to contain or define an acute angle therebetween.

As shown in FIG. 11, the third member 154 has a recess 228 which opens in the side surface 214 and has a chute-forming surface 226 as an inclined surface whose inclination angle is equal to that of the chute-forming groove 186. The chute-forming surface 226 faces downward.

The second and third members 152, 154 are assembled with each other and then are fixed to the main frame 70 of the EC feeder 12. In a state after the second and third members 152, 154 are assembled with each other, the side surfaces 172, 214 are held in contact with each other, and the projecting portion of the side surface 172 of the second member 152 is fit in the recess 228 of the third member 154. Thus, the chute-forming surface 226 of the third member 154 is aligned with the chute-forming groove 186 of the second member. The projecting portions 170, 212 cooperate with each other to provide a projection 230, on which the first member 150 fits, so that the first member 150 is positioned relative to the second and third members 152, 154 and is fixed to the main fame 70.

Figure 8:
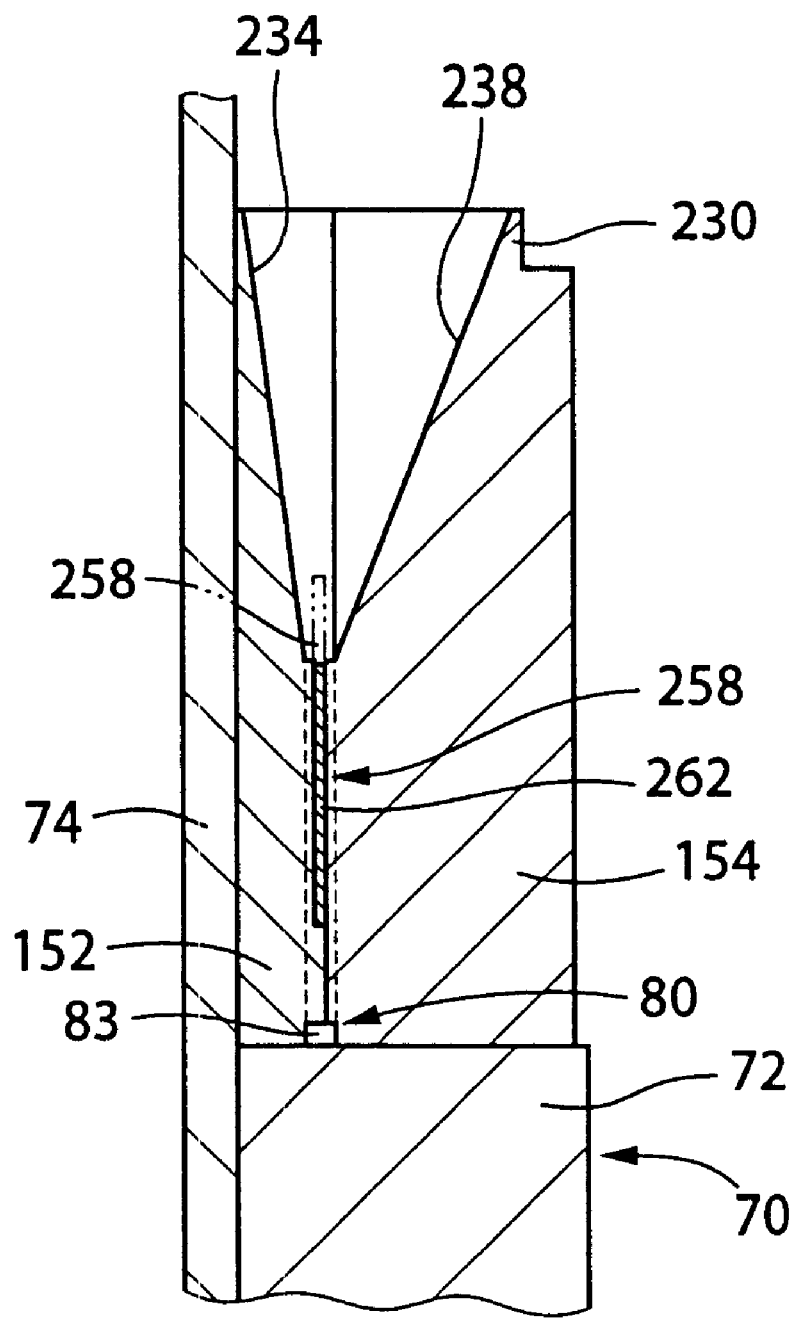
FIG. 8 is a cross-sectioned view taken along plane 8—8 in FIG. 5.
Figure 9:
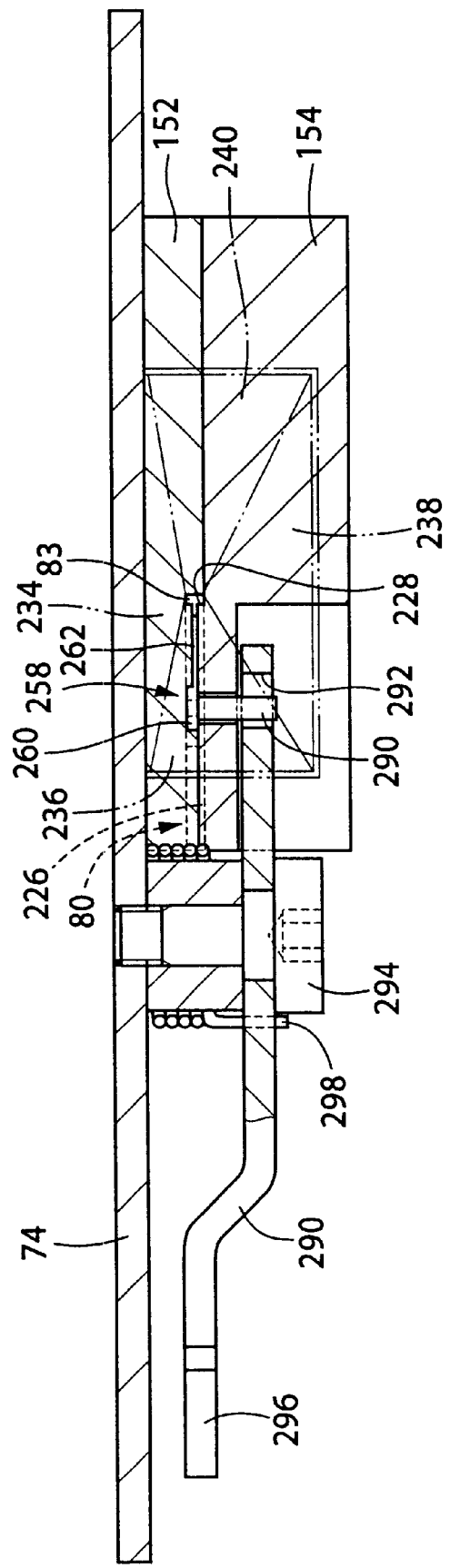
FIG. 9 is a cross-sectioned plan view taken along plane 9—9 in FIG. 5.

As shown in FIGS. 5, 6, and 9, the recess-forming surfaces 176, 178, 180 and the recess-forming surfaces 218, 220, 222 cooperate with each other to provide four inclined surfaces 234, 236, 238, 240 which are inclined toward one another as those surfaces 234, 236, 238, 240 extend downward. The second inclined surface 236 is continuous with the side surface 158 of the first member 150; the fourth inclined surface 240 is continuous with the side surface 160; as shown in FIGS. 6 and 8, the first and third inclined surfaces 234, 238 cooperate with each other to contain an acute angle; and, as shown in FIG. 5, the second and fourth surfaces 236, 240 cooperate with each other to contain a rectangle.

Figure 12:
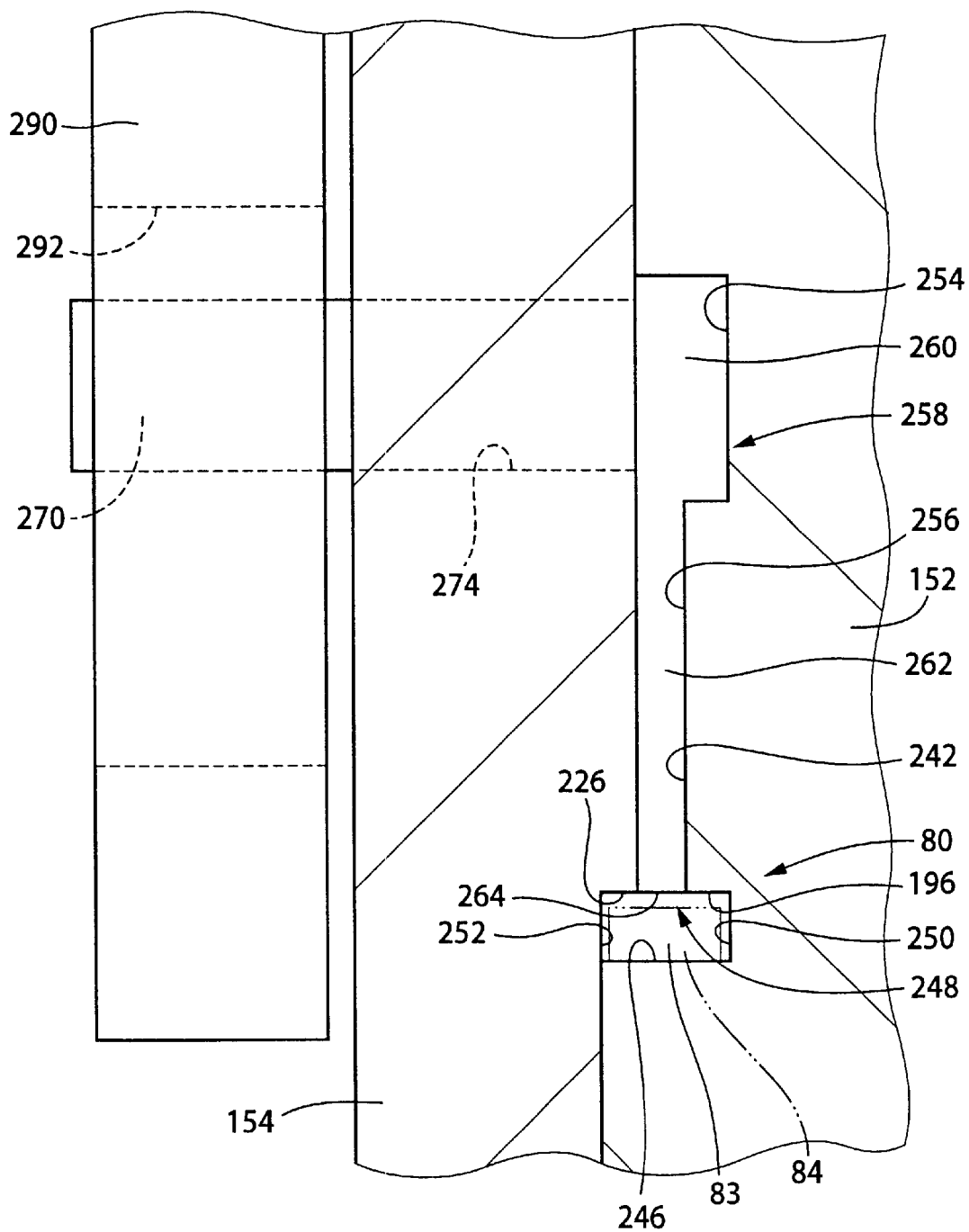
FIG. 12 is an enlarged, cross-sectioned side elevation view showing a state in which a discharging-promoting plate and the second and third members cooperate with one another to provide the chute.

Since the third member 154 closes the opening of the plate-fit recess 194 in the side surface 172 of the second member 152, a plate-fit hole 242 as the discharging-promoting-member-fit hole is defined as shown in FIG. 12. The plate-fit hole 242 is inclined to extend parallel to the third recess-forming surface 180. As shown in FIGS. 5 and 8, since the opening of the chute-forming groove 186 is closed by the third member 154, an initial end portion 244 of the chute 80 on the side of the hopper 82 is defined. A passage present in the initial end portion 244 of the chute 80 provides an initial end portion of the EC-feed passage 83 on the side of the hopper 82.

The bottom surface 188 of the chute-forming groove 186 that is flush with the third recess-forming surface 180 providing the fourth inclined surface 240, provides a bottom wall surface 246 of the feed passage 83 that is flush with the fourth inclined surface 180; the chute-forming surface 226 of the third member 154 cooperate with the top surface 196 of the groove 186 to provide a top wall surface 248 (see FIGS. 5 and 12) and the passage 83 that is opposite to the fourth inclined surface 180 and the bottom surface 246; and the vertical (or bottom) surface of the groove 186 and the vertical surface of the third member 154 that is perpendicular to the chute-forming surface 226 cooperate with each other to provide two side wall surfaces 250, 252 of the passage 83, respectively. The four wall surfaces 246, 248, 250, 252 define the rectangle as the transverse cross section of the passage 83; and the initial end portion 244 of the chute 80 on the side of the hopper 82 opens in the first inclined surface 236 and extends from the lowest portion of the hopper 82 in a direction inclined with respect to a horizontal plane, that is, parallel to the fourth inclined surface 240.

As shown in FIG. 9, each of the second and fourth inclined surfaces 236, 240 of the hopper 82 is defined by a set of straight lines parallel to the widthwise direction of the chute 80, and the width of the each surface 236, 240 gradually decreases as the each surface 236, 240 approaches the upper end of the chute 80, and is equal to that of the feed passage 83 at a position where the each surface 236, 240 is connected to the chute 80. In the present embodiment, each of the second and fourth inclined surfaces 236, 240 provides an inclined bottom surface; and the first and third inclined surfaces 234, 238 provide two side-edge defining surfaces which define opposite side edges or ends of the inclined bottom surface, respectively, and each of which intersects the inclined bottom surface. The four inclined surfaces 234, 236, 238, 240 provide a bottom surface of the hopper 82 that is inclined like a funnel; the hopper 82 has a container-like shape for accommodating a number of ECs 84 in bulk; and the first member 150 cooperates with respective portions of the second and third members 152, 154 that define the four inclined surfaces 234, 246, 238, 240, to provide the hopper 82.

As shown in FIGS. 5 and 12, the plate-fit hole 242 includes a wide portion 254 and a narrow portion 256 whose width is smaller than that of the wide portion 254. A discharging-promoting plate 258 as a discharging-promoting member is fit in the hole 242 such that the plate 258 is movable relative to the chute 80. That is, the plate 258 is provided in association with the initial-end portion 244 of the chute 80 on the side of the hopper 82, such that the plate 258 is movable in a direction parallel to the direction of inclination of the end portion 244 of the chute 80. The plate 258 is a generally flat member which has a stepped shape including a wide portion 260 and a narrow portion 262 narrower than the wide portion 260. The wide portion 260 is fit in the wide portion 254 of the hole 242 and the narrow portion 262 is fit in the narrow portion 256 of the hole 242.

The widthwise direction of the plate-fit hole 242 is horizontal, and the height of the hole 242 is greater than the width thereof. The thicknesswise direction of the discharging-promoting plate 258 is horizontal, and the wide portion 260 of the plate 258 is fit in the wide portion 254 of the hole 242, so that the plate 258 is supported on the second member 152. As shown in FIG. 12, the plate 258 has a lower surface 264 that is a side surface thereof extending parallel to the thicknesswise direction thereof and is flush with the top surface 196 of the chute-forming groove 186 and the chute-forming surface 226 of the third member 154. The discharging-promoting plate 258 is opposite to the fourth inclined surface 240 as a portion of the bottom surface of the hopper 82, with respect to the opening of the chute 80 in the bottom surface of the hopper 82. The plate 258 cooperates with the second and third members 152, 154 to define the top wall surface 246 of the EC-feed passage 83. That is, the plate 258 provides a portion of the initial-end portion 244 of the chute 80 that defines the four wall surfaces 246, 248, 250, 252 of the passage 83 having the rectangular cross section.

As shown in FIG. 7, an engage pin 270 projects from the wide portion 260 of the discharging-promoting plate 258, such that the engage pin 270 is movable with the plate 258. The engage pin 270 extends in a horizontal direction perpendicular to the direction of movement of the plate 258 and parallel to the widthwise direction of the EC feeder 12. A free end portion of the pin 270 passes through an elongate hole 274 formed in the third member 154 and projects from the third member 154. The elongate hole 274 extends parallel to the direction of movement of the plate 258, and the engage pin 270 is fit in the elongate hole 274 such that the pin 270 is movable relative to the hole 274 in a lengthwise direction of the hole 274. The movement of the plate 258 is guided because the wide portion 260 of the plate 258 is fit in, and moved relative to, the wide portion 254 of the plate-fit hole 242. Thus, the wide portion 260 of the plate 258 and the wide portion 254 of the hole 242 cooperate with each other to provide a guide device.

As shown in FIG. 5, the free end portion of the engage pin 270 is fit in an elongate hole 292 formed in an end portion of an engage lever 290. As shown in FIGS. 2 and 5, the engage lever 290 is attached to the main frame 70 via an axis member 294 such that the lever 290 is pivotable about an axis line parallel to the widthwise direction of the main frame 70. The elongate hole 292 is formed in the end portion of the lever 290 that projects from the axis member 294, such that the elongate hole 292 extends substantially perpendicular to the elongate hole 274 formed in the third member 154. Thus, the elongate hole 292 is revolveable about the axis line perpendicular to the direction of movement of the plate 258. As shown in FIG. 2, the other end portion of the engage lever 290 provides an engage portion 296 which engages the elevator link 114. A spring member 298 as a sort of elastic member as a sort of biasing device that is provided between the main frame 70 and the engage lever 290, biases the engage lever 290 in a direction in which the engage portion 296 engages the elevator link 114.

Therefore, when the elevator link 114 is moved down and up, the engage lever 290 is pivoted and the discharging-promoting plate 258 is moved. In the state in which the link 114 is positioned at its upper-dead position, the lever 290 is positioned at its first angular position indicated at solid line in FIG. 5, and the plate 258 is positioned at its retracted position, indicated at broken line in FIG. 5, where the plate 258 is retracted into the plate-fit hole 242 and a free end surface of the plate 258 is flush with the second inclined surface 236.

When the elevator link 114 is lowered, the engage lever 290 is pivoted against the biasing action of the spring member 298, so that the lever 290 is moved to its second angular position indicated at two-dot chain line in FIG. 5. Thus, the elongate hole 292 is revolved, and the engage pin 270 is linearly moved in the elongate hole 274, so that the discharging-promoting plate 258 is moved in a direction parallel to the direction of inclination of the initial-end portion 244 of the chute 80, and is positioned at its advanced position, indicated at two-dot chain line in FIG. 5, where a free end portion of the plate 258 projects into the hopper 82. When the elevator link 114 is elevated, the engage lever 290 is pivoted by the biasing action of the spring member 298 to follow the link 114, so that the plate 258 is retracted to its retracted position. That is, when the elevator link 114 is vertically reciprocated one time, the engage lever 290 is pivoted forward and backward, one time. That is, each time one EC 84 is taken out by the EC-suck head 22, the plate 258 is reciprocated one time.

In the present embodiment, the engage pin 270 provides a cam follower; the elongate hole 292 provides an engage hole as a sort of engage recess; the engage lever 290 provides a cam; and the pin 270, the hole 292, and the lever 290 cooperate with the elevator link 114 to provide a discharging-promoting-plate drive device as a sort of drive device. The engage pin 270 and the engage lever 290 cooperate with each other to provide a converting device which converts one reciprocative movement of the elevator link 114 as a sort of reciprocating member as a sort of driven member, into one reciprocative movement of the discharging-promoting plate 258. The index servomotor 26 provides a drive source which is provided outside the EC feeder 12 or the arranging and supplying apparatus. In the present embodiment, the discharging-promoting-plate drive device, the plunger-pump drive device 142, and the shutter drive device 144 commonly employs the elevator link 114, and accordingly the EC feeder enjoys a simple construction. In addition, since the three drive devices are mechanically operated, the EC feeder 12 does not need any electric wiring. Moreover, since each EC feeder 12 employs the plunger pump 100 which sucks the air in the chute 80, the present EC mounting machine does not need means for supplying electric power or negative pressure to each EC feeder 12.

The present EC mounting machine is controlled by a control device 310 shown in FIG. 1. The control device 310 is essentially provided by a computer, and controls the index servomotor 26, the X-axis servomotor 50, etc.

When the EC mounting machine constructed as described above mounts the ECs 84 on the printed-wiring board 18, the X-axis table 44 is moved in the X-axis direction so that the respective EC-supply portions of the EC feeders 12 are sequentially positioned at the EC-supply position where each of the EC feeders 12 supplies, from the EC-supply portion thereof, the ECs 84 to the EC mounting system 14. As described previously, when the elevator member 140 is lowered, the shutter member 124 is moved from its operative position to its inoperative or retracted position, so as to allow the EC-suck head 22 to take out the EC 84 from the EC feeder 12. As the head 22 sucks and take out one EC 84, the discharging-promoting plate 258 is moved from its retracted position to its advanced position.

Owing to the respective lower inclined portions of the side surfaces 158, 162 and the four inclined surfaces 234, 246, 238, 240 of the hopper 82, the ECs 84 accommodated in the hopper 82 are moved toward the lowest portion of the hopper 82 around the opening of the initial end portion 244 of the chute 80. When the discharge-promoting plate 258 is advanced into the hopper 82, the ECs 84 present around the opening of the chute 80 are moved and promoted to enter the opening. Even if the ECs 84 clog the opening or make a "bridge" over the opening, the plate 258 breaks the clogging or the bridge, thereby promoting the entering of each EC 84 into the chute 80. Since the bottom wall surface 246 of the EC-supply passage 83 is inclined in the same direction as that in which the fourth inclined surface 240 is inclined, and is flush with the fourth surface 240, the ECs 84 directly riding on the fourth surface 240 slide on the surface 240 and move toward the opening of the chute 80. Only the EC 84 whose transverse-cross-section phase or angular position coincides with that of the EC-supply passage 83 can enter the opening of the chute 80. Thus, each EC 84 enters the chute 80 while taking such a posture that the lengthwise direction of the each EC 84 is parallel to that of the supply passage 83. Owing to the inclination of the initial-end portion 244 of the chute 80, each EC 84 is moved toward the horizontal portion 86 of the same 80, while being arranged into an array. Since the air in the chute 80 is sucked by the plunger pump 100 and the air flow is produced in the chute 80, the ECs 84 are moved in the array toward the EC-supply portion of the EC feeder 12.

When the elevator link 114 is elevated, the discharging-promoting plate 258 is retracted into the plate-fit hole 242. As the plate 258 is retracted, the ECs 84 present around the plate 258 move to follow the plate 258 toward the opening of the initial end portion 244 of the chute 80, so that only the EC 84 whose transverse-cross-section phase or angular position coincides with that of the EC-supply passage 83 can enter the opening of the chute 80.

As shown in FIG. 8, a wedge-like space is present between the discharging-promoting plate 258 and each of the first and third inclined surfaces 234, 238. When the plate 258 is retracted into the plate-fit hole 242, one or more ECs 84 may clog this wedge-like space, thereby stopping the retracting movement of the plate 258. However, this does not cause any troubles. When the plate 258 is retracted, the spring member 298 biases the engage lever 290 so that the lever 290 follows the elevator link 114. If the plate 258 is not retracted any more, the engage portion 296 of the lever 290 is just moved away from the elevator link 114, and not so great a retracting force is applied to the plate 258. Thus, the plate 258 and the ECs 84 are effectively prevented from being damaged.

The two inclined surfaces 236, 240 contain a rectangle, and the discharging-promoting plate 258 that is movable in opposite directions parallel to the fourth inclined surface 240, projects into the lowest portion of the hopper 82, while taking a posture perpendicular to the second inclined surface 236. Since each of the opposite vertical surfaces of the plate 258 and the second inclined surface 236 contain a rectangle, the ECs 84 are not bitten by the plate 258 and the surface 236 when the plate 258 is retracted into the hole 242.

As the discharging-promoting plate 258 is moved toward its advanced position, a space is produced in the direction of movement of the plate 258, between a rear end surface of the plate 258 and a surface of the plate-fit hole 242 that faces the rear end surface and extends in a direction perpendicular to the direction of movement of the plate 258. However, as described previously, the top wall surface 248 of the initial-end portion 244 of the chute 80 is defined by the cooperation of the second and third members 152, 154 and the plate 258, and the width of the space produced by the movement of the plate 258 is smaller than the long sides of the rectangle as the transverse cross section of each EC 84. Thus, each EC 84 cannot enter the produced space. In addition, in the present embodiment, in the state in which the plate 258 is positioned at its advanced position, the rear end portion of the plate 258 still remains in the front end portion of the hole 242. That is, irrespective of which position the plate 258 takes relative to the chute 80, the top wall surface 248 maintains continuity in the lengthwise direction of the chute 80. That is, the lower surface 264 of the plate 258 continues to overlap at least partly both the top surface 196 of the chute-forming groove 186 of the second member 152 and the chute-forming surface 226 of the third member 154, as seen in the width-wise direction of the chute 80.

When the discharging-promoting plate 258 is advanced, only the second and third members 152, 154 maintain the continuity of a portion of the top wall surface 248 that corresponds to the space produced by the advancement of the plate 258, and the second and third members 152, 154 cooperate with the plate 258 to maintain the continuity of a portion of the top wall surface 248 that corresponds to the rear end portion of the plate 258 remaining in the front end portion of the hole 242. Thus, each EC 84 cannot enter the space thus produced in the top wall surface 248. That is, each EC 84 is prevented from being bitten by the plate 258 and the chute 80, and is smoothly moved in the chute 80.

In the present embodiment, the plate member 258 is employed as the discharging-promoting member. However, it is possible to employ a grooved member as the discharging-promoting member. In addition, in the present embodiment, the discharging-promoting plate 258 is reciprocated one time each time one EC 84 is taken out by the EC-suck head 22. However, it is possible to reciprocate the discharging-promoting member two or more times each time one EC 84 is taken out by the head 22. Those features are employed in another arranging and feeding apparatus as a second embodiment of the present invention, shown in FIGS. 13 to 18.

Figure 13:
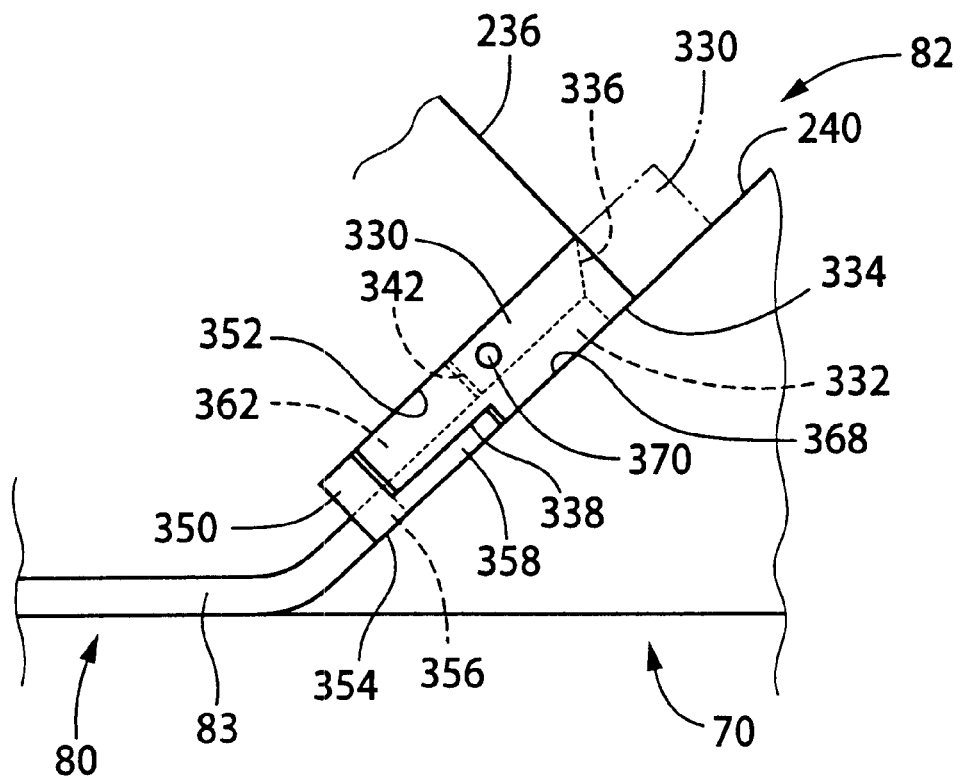
FIG. 13 is a front elevation view of a discharging-promoting member as an element of another EC arranging and supplying device as a second embodiment of the present invention.
Figure 14:
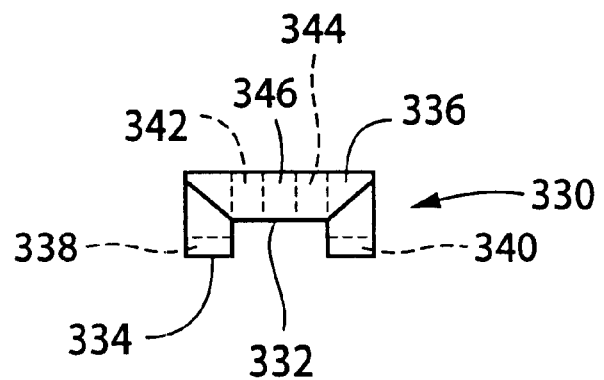
FIG. 14 is a right-hand-side elevation view of the discharging-promoting member of FIG. 13.
Figure 15:
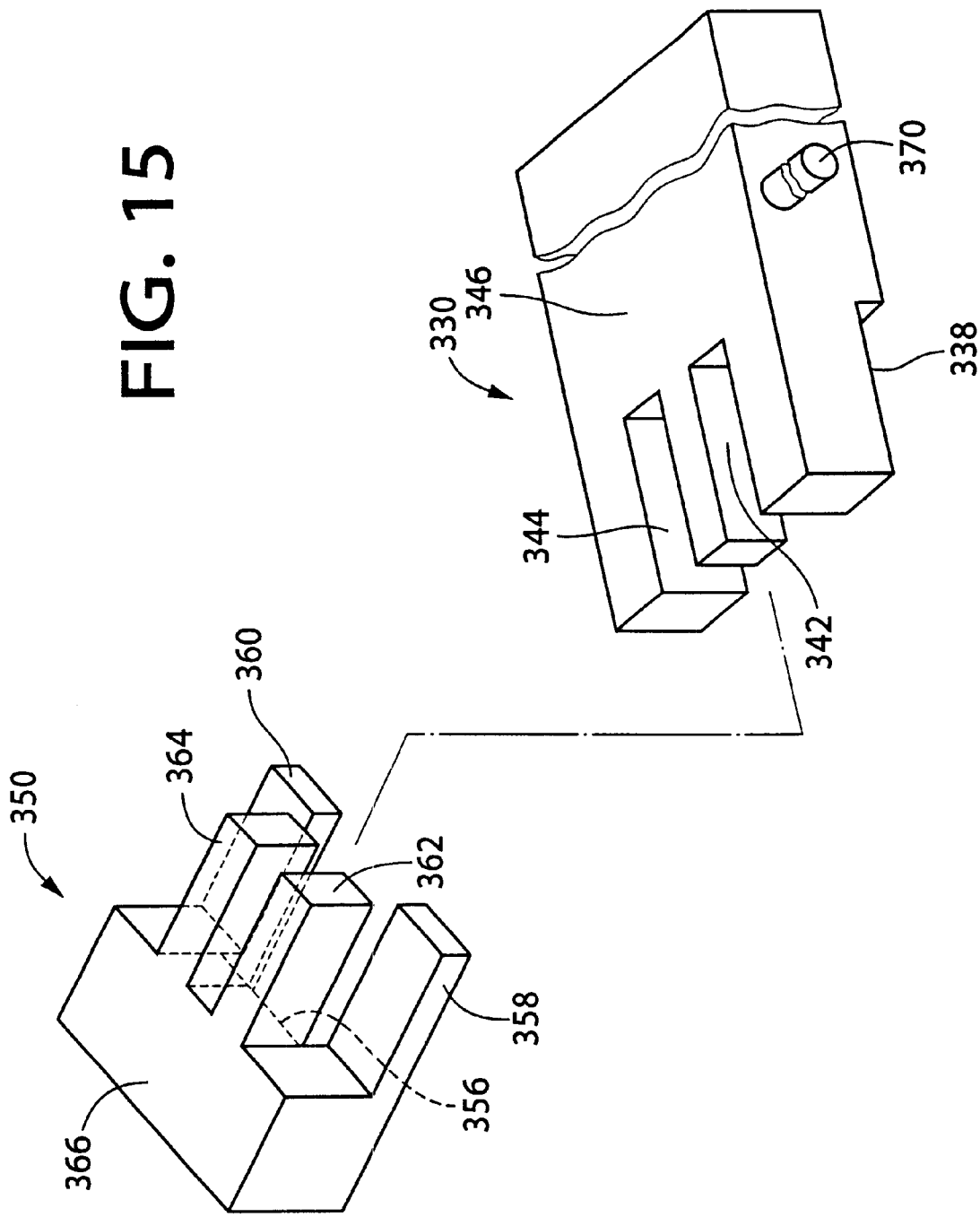
FIG. 15 is an exploded perspective view of the discharging-promoting member and a chute-forming member of the EC arranging and supplying device of FIG. 13.

The present arranging and feeding apparatus includes a discharging-promoting member 330 which is provided by a grooved member having a groove 332 which has a rectangular transverse cross section, opens in a side surface 334, and extends in a lengthwise direction of the member 330. As shown in FIGS. 13 and 14, a lengthwise end surface 336 of the promoting member 330, on the side of the hopper 82, is inclined such that as the end surface 336 approaches the center of the EC-supply passage 83, the surface 336 extends in a downstream direction of the passage 83. In addition, as shown in FIGS. 14 and 15, the promoting member 330 has four recesses 338, 340, 342, 344 which are formed in an end portion thereof remote from the hopper 82 and which extend parallel to the groove 332. Each of the first and second recesses 338, 340 has a depth equal to half a depth of the groove 332. The two recesses 338, 340 are provided on both sides of the groove 332, respectively, and each open in the side surface 334. The third and fourth recesses 342, 344 is formed through a thickness of a base portion 346 of the promoting member 330, and each have a width shorter than the long sides of the rectangle as the transverse cross section of the groove 332.

The discharging-promoting member 330 is assembled with a chute-forming member 350, and the assembled members 330, 350 are fit in a fit hole 352, shown in FIG. 13, which is formed in the main frame 70 of a EC feeder 12. The chute-forming member 350 is provided by a grooved member which is like the grooved member as the promoting member 330 and has a groove 356 having a rectangular transverse cross section and opening in a side surface 354. The chute-forming member 350 has projections 358, 360, 362, 364 extending parallel to the groove 356. The first and second projections 358, 360 have a height equal to half the depth of the groove 356, and have respective lower surfaces flush with the side surface 354. The third and fourth projections 362, 364 project from a base portion 366 of the chute-forming member 350, each have a width shorter than the long sides of the rectangle as the transverse cross section of the groove 356, and each have a height equal to a thickness of the base portion 366.

The chute-forming member 350 is fit in the fit hole 352 and thereby fixed to the main frame 70. The discharging-promoter member 330 is fit in the fit hole 352 such that the promoting member 330 is movable relative to the hole 352 in the lengthwise direction thereof. In addition, the four recesses 338, 340, 342, 344 of the promoting member 330 are engaged with the four projections 358, 360, 362, 364 of the member 350 such that the former member 330 is movable relative to the latter member 350. The fit hole 352 has a rectangular transverse cross section, and is inclined parallel to the inclined surface 240 as part of the bottom surface of the hopper 82. A bottom surface 368 of the fit hole 352 is flush with the inclined surface 240. The promoting member 330 and the chute-forming member 350 are fit in the fit hole 352 such that the respective side surfaces 334, 354 of the two members 330, 350 are opposed to the bottom surface 368 and the inclined surface 240. The grooves 332, 352 closed by the bottom surface 368 of the fit hole 352 define an end portion of the EC-supply passage 83 on the side of the hopper 83. More specifically described, in the hopper-side end portion of the supply passage 83, three of four wall surfaces defining the rectangle as the cross section of the passage 83 are provided by the promoting member 330, and the last wall surface is provided by the hopper-side end portion of the chute 80.

The transverse cross section of the groove 356 formed in the chute-forming member 350 has the same shape and dimensions as those of the cross section of the groove 332 formed in the discharging-promoting member 330. Therefore, three wall surfaces defining the groove 356 are flush with corresponding three wall surfaces defining the groove 332. In addition, respective surfaces of the four projections 358, 360, 362, 364 that define the hopper-side end portion of the chute 80, are flush with corresponding surfaces of respective portions of the promoting member 330 that define the four recesses 338, 340, 342, 344. Thus, the two grooves 356, 332 are continuous with each other with no step present therebetween, so that each EC 84 is smoothly moved without being caught by the grooves 356, 332. Moreover, wall surfaces defining a connection portion of the chute 80 that opens in the fit hole 352 are flush with the corresponding walls surfaces defining the groove 356 of the chute-forming member 350. Therefore, when each EC 84 is moved from the promoting member 330 to the connection portion of the chute 80 via the chute-forming member 350, each EC 84 does not collide with the opening of the groove 356 or the opening of the connection portion of the chute 80, and is smoothly moved forward.

In the present embodiment, the recesses 338, 340, 342, 344 of the discharging-promoting member 330 and the projections 358, 360, 362, 364 of the chute-forming member 350 have respective dimensions which assure that when the promoting member 330 is positioned at the advanced position, indicated at two-dot chain line in FIG. 13, the recesses 338, 340, 342, 344 are not completely disengaged from the projections 358, 360, 362, 364. That is, irrespective of which position the promoting member 330 may take relative to the end portion of the chute 80, each of the three passage-defining wall surfaces provided by the promoting member 330 and the chute-forming member 350 maintains its continuity in the lengthwise direction of the chute 80.

Figure 16:
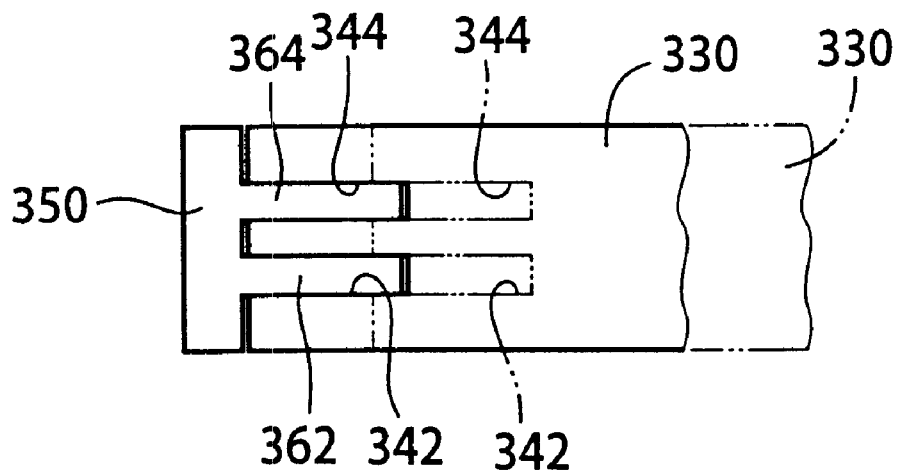
FIG. 16 is a plan view showing a state in which the discharging-promoting member of FIG. 13 is advanced relative to the chute-forming member.
Figure 17:
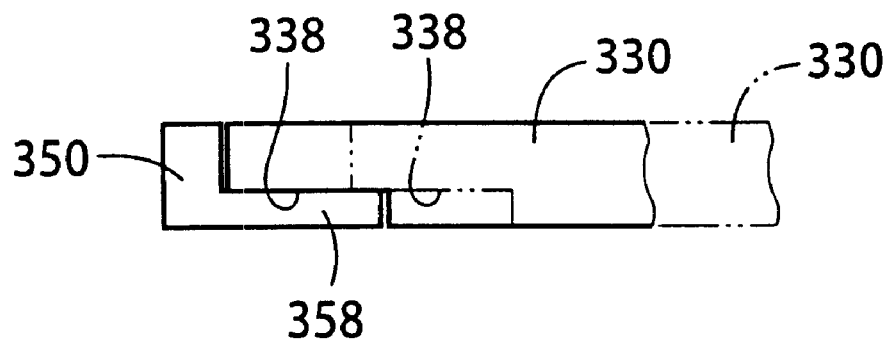
FIG. 17 is a front elevation view showing the state in which the discharging-promoting member of FIG. 13 is advanced relative to the chute-forming member.

When the discharging-promoting member 330 is moved to the advanced position, the two recesses 342, 344 are moved relative to the two projections 362, 364, as indicated at two-dot chain line in FIG. 16. Thus, two spaces are produced between the promoting member 330 and the chute-forming member 350. The continuity of the top wall surface of the EC-supply passage 83 in the widthwise direction thereof is broken by those spaces. However, the recesses 342, 344 are not completely separated from the projections 362, 364, and the top wall surface of the passage 83 maintains its continuity in the lengthwise direction thereof. That is, when the promoting member 330 is positioned at the advanced position, respective rear end portions of the recesses 342, 344 of the promoting member 330 overlap respective front end portions of the projections 362, 364 of the chute-forming member 350, and the top wall surface of the passage 83 maintains its continuity via those overlapping portions. In addition, the width of the each of the two recesses 342, 344 is shorter than the long sides of the rectangle as the transverse cross section of the groove 332 or each EC 84. Thus, each EC 84 cannot enter each of the two spaces produced between the two members 330, 350. Therefore, each EC 84 can be smoothly moved forward in the chute 80, without being caught in the spaces produced when the promoting member 330 is advanced to the advanced position.

The above explanation made for the top wall surface of the EC-supply passage 83 applies to the two vertical, side wall surfaces of the passage 83. A brief explanation will be made for only one of the two side wall surfaces. When the discharging-promoting member 330 is moved to the advanced position, the recess 338 is moved relative to the projection 358, as indicated at two-dot chain line in FIG. 17.

However, the recess 338 is not completely separated from the projection 358, and the side wall surface of the passage 83 maintains its continuity in the lengthwise direction thereof. That is, when the promoting member 330 is positioned at the advanced position, a rear end portion of the recess 338 of the promoting member 330 overlaps a front end portion of the projection 358 of the chute-forming member 350, and the side wall surface maintains its continuity via the overlapping portion. In addition, the height of the recesses 338 is shorter than the short sides of the rectangle as the transverse cross section of the groove 332 or each EC 84. Thus, each EC 84 cannot enter the space produced between the two members 330, 350 when the promoting member 330 is advanced to the advanced position, and can be smoothly moved forward in the chute 80 without being caught in the space.

The discharging-promoting member 330 is supported by the chute-forming member 350 such that two portions of the former member 330 that define the two recesses 338, 340 are placed on the two projections 358, 360 of the latter member 350, respectively, and is restrained by the latter member 350 such that a central portion of the former member 330 that defines the two recesses 342, 342 is held by the two projections 362, 364 of the latter member 350 in the widthwise direction of the passage 83. Thus, the promoting member 330 can be stably reciprocated.

Figure 18:
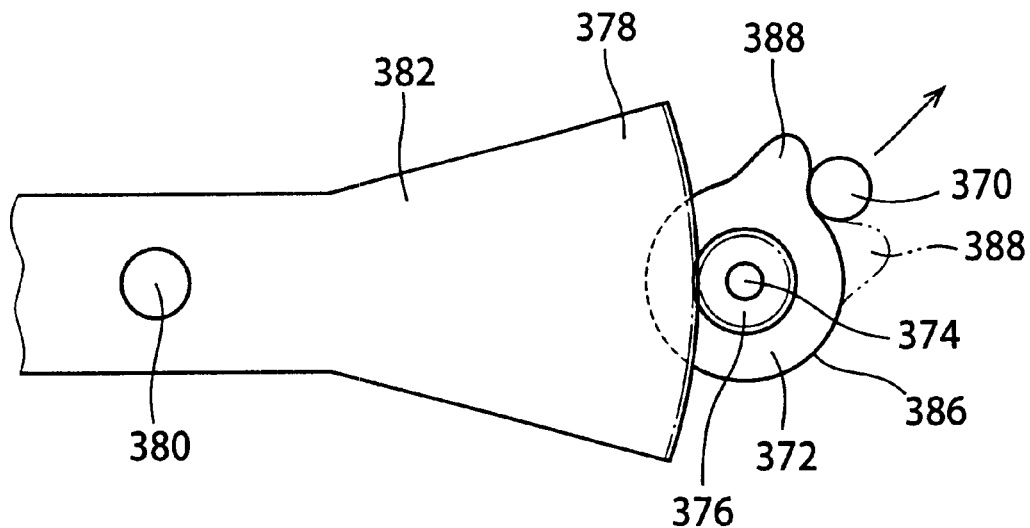
FIG. 18 is a schematic front elevation view of a drive device which drives the discharging-promoting member of FIG. 13.

As shown in FIG. 15, an engage pin 370 projects from an outer surface of the discharging-promoting member 330, in a horizontal direction perpendicular to the direction of movement of the member 330. As shown in FIG. 18, the engage pin 370 is engaged with a plate cam 372 as a rotary cam as a sort of a cam. The plate cam 372 is attached via an axis member 374 to the main frame 70 of the EC feeder 12, such that the plate cam 372 is rotatable about an axis line which is perpendicular to the direction of movement of the promoting member 330 and extends in the widthwise direction of the feeder 12. A gear 376 is attached to the plate cam 372, such that the gear 376 is concentric with the cam 372 and is not rotatable relative to the same 372. The gear 376 is meshed with a sector gear 378 integral with an engage lever 382 which is attached via an axis member 380 to the main frame 70 of the EC feeder 12 such that the engage lever 382 is pivotable about an axis line extending in the widthwise direction of the feeder 12. The sector gear 378 has its center on the axis line of pivotal motion of the engage lever 382. Like the cam lever 200 employed in the first embodiment, the engage lever 382 is pivotable in opposite directions, when the elevator link 114 is moved upward and downward.

An outer circumferential surface of the plate cam 372 provides a cam surface 386 which includes a single projecting portion 388 whose distance from the axis line (i.e., the axis member 374) gradually increases and then gradually decreases, with respect to a basic circle of the cam surface 388, both when the plate cam 372 is rotated in a forward direction and when the cam 372 is rotated in a backward direction. A spring member (not shown) as an elastic member as a sort of biasing device biases the engage pin 370 in a direction in which the pin 370 engages the cam surface 386.

When the elevator link 114 is moved downward, the engage lever 382 is pivoted in a forward direction (counterclockwise in FIG. 18) and, owing to the meshing of the sector gear 378 and the gear 376, the plate cam 372 is rotated in the forward direction (clockwise in FIG. 18), so that the projecting portion 388 first moves up the engage pin 370 against the biasing force of the spring member and then allows the pin 370 to move down. Thus, the promoting member 330 is reciprocated between the retracted and advanced positions, one time. The projecting portion 388 is moved from one side of the engage pin 370, indicated at solid line in FIG. 18, to the other side of the same 370, indicated at two-dot chain line.

When the discharging-promoter member 330 is advanced, the member 330 moves the ECs 84 stored in the hopper 82, thereby promoting the discharging of the ECs 84 into the chute 80. Since the hopper-side end surface 336 of the promoting member 330 is inclined in a direction toward the downstream side of the chute 80, the inclination of the end surface 336 guides each EC 84 to enter the chute 80, thereby helping the EC 84 enter the chute 80.

When the elevator link 114 is moved up, the engage lever 382 is pivoted in a backward direction (clockwise in FIG. 18), and the plate cam 372 is rotated in the backward direction (counterclockwise in FIG. 18), so that the engage pin 370 climbs over the projecting portion 388 of the cam surface 386 and the promoting member 330 is reciprocated one time. Thus, in the second embodiment, each time one EC 84 is supplied from the EC feeder 12, the promoting member 330 is reciprocated two times. In the present embodiment, the engage pin 370 as a cam follower, the plate cam 372, the gear 376, the sector gear 378, and the engage lever 382 cooperate with one another to provide a motion converting device which converts the single reciprocative motion of the elevator link 114 into the plurality of reciprocative motions of the promoting member 330. The motion converting device cooperates with the elevator link 114 as a reciprocateable member as a driven member, to provide a drive device. The gear ratio of the gear 376 and the sector gear 378 is determined at a value which assures that while the engage lever 382 is pivoted in the forward or backward direction when the elevator link 114 is moved down or up, the plate cam 372 is rotated by an angle sufficient to cause the engage pin 370 to climb over the projecting portion 388.

The feature that each time one EC 84 is supplied from the EC feeder 12, the discharging-promoting member 330 is reciprocated two times, may be employed in the first embodiment, shown in FIGS. 1 to 12, in which the discharging-promoting member is provided by the flat member 258.

The cam surface 386 of the plate cam 372 may include two or more projecting portions 388. In this case, when the plate cam 372 is rotated in one direction, i.e., the forward or backward direction, the discharging-promoting 330 is reciprocated two or more times.

Figure 19:
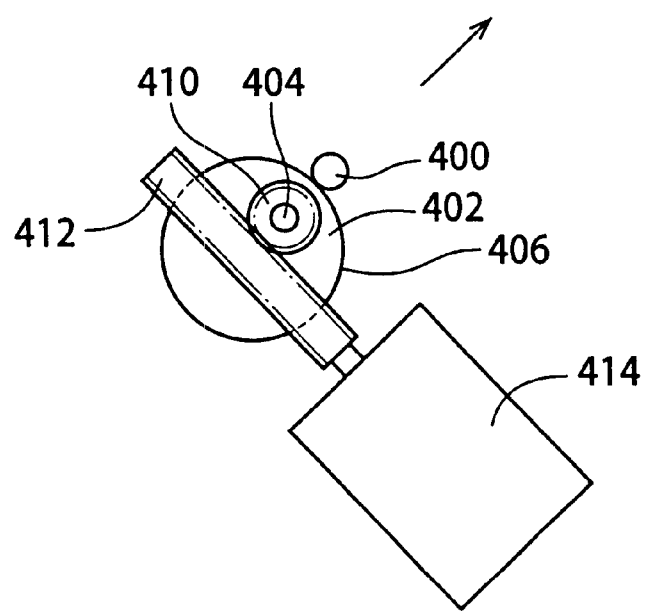
FIG. 19 is a schematic front elevation view of a drive device which drives a discharging-promoting member as an element of another EC arranging and supplying device as a third embodiment of the present invention.

Although in each of the first and second embodiments the index servomotor 26 as the drive source is provided outside the main frame 70 of each EC feeder 12, it is possible that a drive source be provided on a main frame 70 of an EC feeder 12, as shown in FIG. 19.

FIG. 19 relates to a third embodiment of the present invention that relates to an arranging and supplying apparatus. The present EC arranging and supplying apparatus includes a flat discharging-promoting member (not shown) identical with the flat member 258 employed in the first embodiment, and an engage pin 400 projecting from an outer surface of the promoting member, in a horizontal direction perpendicular to the direction of movement of the promoting member.

An eccentric cam 402 as a sort of rotary cam is attached via an axis member 404 to the main frame 70 of the EC feeder 12, such that the eccentric arm 402 is rotatable about a horizontal axis line which is perpendicular to the direction of movement of the discharging-promoting member (not shown). A spring member (not shown) as an elastic member as a sort of biasing device biases the engage pin 400 in a direction in which the engage pin 400 engages a cam surface 406 of the eccentric cam 402. A worm wheel 410 is attached to the eccentric cam 402 such that the worm wheel 410 is not rotatable relative to the eccentric cam 402, and is rotatable about the axis member 404. The worm wheel 410 is meshed with a worm 412 which is rotated by an electric rotary motor 414 as an electric motor as a sort of drive source that is provided on the main frame 70 of the EC feeder 12. In the present embodiment, the electric rotary motor 414 is provided by a servomotor, and is controlled by the control device 310 which additionally controls the EC mounting machine including the index servomotor 26, etc.

When the worm 412 is rotated by the servomotor 414, the worm wheel 410 is rotated and the eccentric cam 402 is also rotated, so that the engage pin 400 is moved. While the eccentric cam 402 is rotated by 360 degrees, the discharging-promoting member is reciprocated one time. While one EC 84 is taken out by the EC-suck head 22, the servomotor 414 is operated or rotated by an amount which causes the eccentric cam 402 to be fully rotated two or more times and accordingly causes the discharging-promoting member to be reciprocated two or more times. Therefore, each EC 84 can have more chances to enter the chute 80, which contributes to improving the reliability of supplying of ECs 84. In the present embodiment, a portion of the control device 310 that controls the servomotor 414 such that while one EC 84 is positioned at the EC-supply portion of the EC feeder 12 and supplied therefrom, the discharging-promoting member is reciprocated two or more times, provides a discharging-promoting-member driving control device.

In the second embodiment, shown in FIGS. 13 to 18, in which the discharging-promoting member 330 is provided by the grooved member, and drive source (e.g., electric rotary motor 414) may be provided on the main frame 70 of the EC feeder 12, and the grooved member may be reciprocated two or more times while one object (e.g., EC 84) is supplied, like in the third embodiment shown in FIG. 19.

Figure 20:
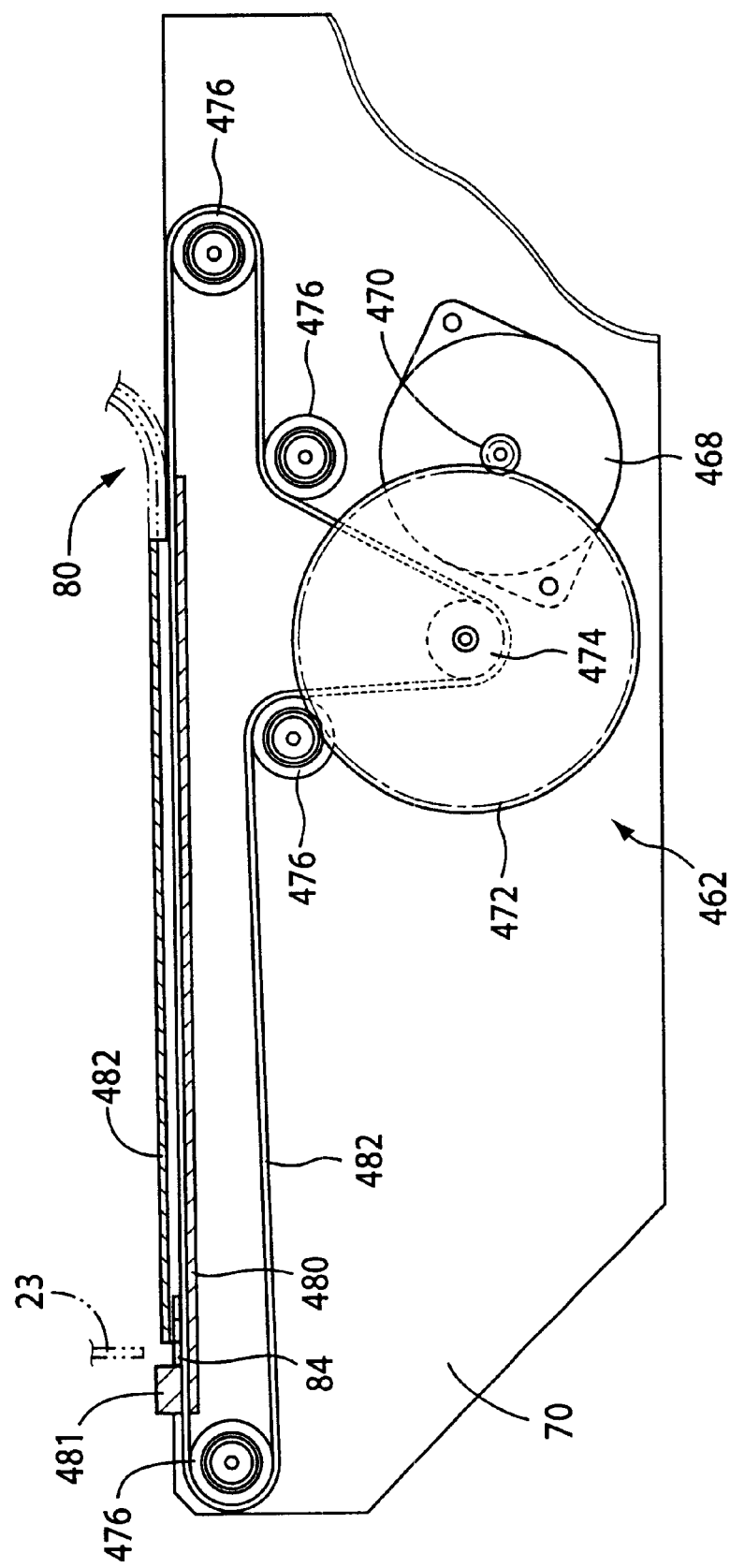
FIG. 20 is a schematic front elevation view of an EC feeding device as an element of another EC arranging and supplying device as a fourth embodiment of the present invention.

Referring next to FIG. 20, there will be described a fourth embodiment of the present invention, which relates to an EC feeder 460 which may be employed in the EC supplying system 10 shown in FIG. 1. The EC feeder 460 employs a belt drive device 462 including an electric rotary motor 468 (e.g., a servomotor or a stepper motor) and a small-diameter and a large-diameter gear 470, 472, for circulating a generally annular, endless belt 482. The small-diameter gear 470 is fixed to an output shaft of the electric motor 468, and is meshed with the large-diameter gear 472, which in turn is meshed with a drive pulley 474. The drive pulley 474 cooperates with four driven pulleys 476 to support the endless belt 482. The drive and driven pulleys 474, 476 are supported by the main frame 70. The electric motor 468 is controlled by the control device 310 (FIG. 1) with respect to its rotation amount or angle in each of its forward and backward directions.

In addition, the EC feeder 460 includes a support member 480 which is fixed to the main frame 70 and which supports an upper horizontal portion of the endless belt 482 passing thereon. The support member 480 includes an upper projection 481 which functions as a stopper for stopping the leading one of the ECs 84 which are fed, while being guided by a guide member 482, on an upper surface of the upper horizontal portion of the endless belt 482 being circulated by the electric motor 468. The ECs 84 fed through the chute 80 are placed one by one onto the upper surface of the belt 482. A horizontal recess is formed in the support member 480 to allow the upper portion of the endless belt 482 to pass therethrough in such a manner that a small clearance remains between the upper surface of the belt 482 and a lower surface of the stopper 481. Thus, the belt 482 can smoothly pass through the recess after the leading EC 84 is stopped by the stopper 481. The leading EC 84 stopped by the stopper 481 is sucked and held by a suction nozzle 21 of the EC-suck head 22 of the EC mounting system 14. Except for the above-described features of the EC feeder 460, the EC feeder 460 is similar to the EC feeder 12.

The control device 310 controls the electric motor 468 to circulate the endless belt 482 in its forward direction by a first predetermined amount sufficient for the leading one of the ECs 84 arranged in the single array to be stopped by the stopper 481, and subsequently circulates the belt 482 in its backward direction by a second predetermined amount smaller than the first predetermined amount so that the leading EC 84 is moved away from the stopper 481 and then is taken out by the suction nozzle 23.

In the fourth embodiment, the electric motor 468, the endless belt 482, the gears 470, 772, and the pulleys 474, 476 cooperate with one another to provide a feeding device which feeds the ECs 84 which is output from the other end portion of the chute 80 that is opposite to the hopper-side end portion thereof and opens in the vicinity of the upper surface of the upper horizontal portion of the endless belt 482.

In each of the illustrated embodiments, the air in the chute 80 is sucked through the end surface 90 of the chute 80. However, the air may be sucked through a different surface of the chute 80, e.g., a bottom surface or a side surface of the chute 80.

Alternatively, it is possible that only a first portion of the chute 80 that is around the EC-take-out aperture 88 be horizontal, and a second portion of the chute 80 that connects between the first portion of the hopper-side end portion of the chute 80 be inclined relative to a horizontal plane, so that ECs 84 are moved forward, because of the inclination of the second portion, toward the EC-take-out aperture 88.

In each of the illustrated embodiments, the EC feeders 12 are ones which supply ECs 84 to an EC mounting system 14 including an index table 20 which includes a plurality of EC-suck heads 22 and which is revolved about an axis line so that the heads 22 suck and hold the ECs 84 and mount the ECs 84 on a printed-wiring board 18. However, the principle of the present invention may be applied to an EC arranging and supplying device of an EC feeder which supplies ECs to an EC mounting system which linearly moves an EC-suck head in one direction to suck and mount ECs, or an EC mounting system which linearly moves an EC-suck head in two directions perpendicular to each other on a reference plane to suck and mount ECs. Depending upon the specific construction of an EC mounting system with which an EC feeder is used, the EC feeder may be one which is linearly moved on a movable table in one direction, as described in the first embodiment, one which is moved in two directions perpendicular to each other on a reference plane, or one which is stationary, i.e., is fixed at a position where ECs are supplied. Thus, each EC mounting system can be called as an EC taking-out system or an EC transferring system.

In each of the illustrated embodiments, the elevator link 114 as the driven member is driven by the drive device which includes the index servomotor 26 as the drive source. However, the elevator link 114 may be driven by a drive device which includes an exclusive drive source other than the index servomotor 26. This drive device including the exclusive drive source may be shared by two or more EC feeders, or may be provided for each one EC feeder only.

While the present invention has been described in its preferred embodiments, the present invention is not limited to the features described in SUMMARY OF THE INVENTION and the features described in PREFERRED EMBODIMENTS OF THE INVENTION and may be embodied with other changes, improvements, and modifications that may occur to a person skilled in the art without departing from the scope and spirit of the invention defined in the appended claims.

What is claimed is:

1. An apparatus for arranging and supplying a plurality of objects, the apparatus comprising:
    a hopper which stores the objects in bulk and which as a funnelform bottom surface at least a portion of which extends in a reference direction inclined with respect to a horizontal plane;
    a chute which includes an end portion extending, from a lowest portion of the hopper, substantially parallel to the reference direction, and which causes the objects arranged in an array to be moved;
    a discharging-promoting member which is provided in a vicinity of the end portion of the chute, which is movable substantially parallel to the reference direction, and which promotes discharging of the objects from the hopper to the chute while arranging the objects into the array; and
    a drive device which reciprocates, relative to the chute, the discharging-promoting member between an advanced position where an end portion of the discharging-promoting member projects into the hopper and a retracted position away from the advanced position.

2. An apparatus according to claim 1, wherein the end portion of the chute has an opening which opens in the bottom surface of the hopper, and the discharging-promoting member and said portion of the bottom surface of the hopper are located on both sides of the opening of the chute, respectively.

3. An apparatus according to claim 1, wherein the discharging-promoting member comprises a flat member which has an elongate cross section taken along a plane perpendicular to the reference direction.

4. An apparatus according to claim 3, wherein the end portion of the chute has an object-supply passage in which the objects are moved, and the flat member extends parallel to a vertical plane and has a lower surface which is parallel to a horizontal direction and which provides a portion of the end portion of the chute and thereby partly defines the object-supply passage.

5. An apparatus according to claim 1, wherein the end portion of the chute has an object-supply passage in which the objects are moved and which has a quadrangular transverse cross section, and the discharging-promoting member comprises a grooved member which has a groove opening in a side surface thereof on a side of said portion of the bottom surface of the hopper.

6. An apparatus according to claim 5, wherein the end portion of the grooved member has an end surface which is inclined such that as the end surface approaches a center of the object-supply passage, the end surface extends in a downstream direction of the object-supply passage.

7. An apparatus according to claim 1, wherein the end portion of the chute has an object-supply passage in which the objects are moved and which has a quadrangular transverse cross section, and the discharging-promoting member provides a portion of the end portion of the chute such that the discharging-promoting member cooperates with the chute to provide four wall surfaces which define the object-supply passage, and wherein the discharging-promoting member is fitted in the chute such that irrespective of which position the discharging-promoting member takes relative to the chute, each of the four wall surfaces maintains continuity in the reference direction.

8. An apparatus according to claim 1, wherein the end portion of the chute has an object-supply passage in which the objects are moved and which has a quadrangular transverse cross section, and said portion of the bottom surface of the hopper comprises an inclined bottom surface which is defined by a set of straight lines perpendicular to the reference direction, whose width in a widthwise direction perpendicular to the reference direction decreases as the inclined bottom surface approaches the end portion of the chute, and whose width is equal to a width of the object-supply passage at a position where the inclined bottom surface is connected to the end portion of the chute, and wherein the bottom surface of the hopper further comprises two side-edge-defining surfaces which define opposite side edges of the inclined bottom surface, respectively.

9. An apparatus according to claim 1, wherein the drive device comprises:
    a cam follower which is provided on the discharging-promoting member such that the cam follower is movable with the discharging-promoting member; and
    a pivotable cam which is pivotable about an axis line perpendicular to the reference direction and which engages the cam follower and converts an own pivotal motion into a linear motion of the cam follower.

10. An apparatus according to claim 9, wherein the cam follower comprises an engage pin which projects from the discharging-promoting member such that the engage pin extends in a direction perpendicular to the reference direction, and the pivotable cam comprises a cam lever which includes a recessed portion which engages the engage pin.

11. An apparatus according to claim 9, wherein the drive device comprises a driven member which is driven by a drive member which is driven by a drive source which is provided outside the apparatus.

12. An apparatus according to claim 11, wherein the driven member comprises a reciprocateable member, and the drive device comprises a motion converting device which converts a single reciprocative movement of the reciprocateable member into a plurality of reciprocative movements of the discharging-promoting member.

13. An apparatus according to claim 9, further comprising a drive source which drives the pivotable cam.

14. An apparatus according to claim 13, wherein the drive source comprises an electric motor.

15. An apparatus according to claim 13, wherein the drive device comprises a driving control device which operates, while the apparatus supplies each one object, the drive source by an amount which causes a plurality of reciprocative movements of the discharging-promoting member.

16. An apparatus according to claim 1, further comprising:
    an object-supply portion from which the apparatus supplies the objects one by one; and
    a feeding device which feeds the objects arranged in the array in the chute, to the object-supply portion.

17. An apparatus according to claim 16, wherein the feeding device comprises an air-flow producing device which generates, in the chute, an air flow in a direction from the hopper toward the object-supply portion.

18. An apparatus according to claim 17, wherein the air-flow producing device comprises a negative-pressure producing device which is connected to the object-supply portion and which sucks an air in the chute and thereby generates the air flow in the direction from the hopper toward the object-supply portion so that the objects in the chute are fed toward the object-supply portion.

19. An apparatus according to claim 16, wherein the feeding device comprises an endless annular belt and a belt drive device which circulates the belt, and the chute includes, in addition to the end portion thereof as a first end portion on a side of the hopper, a second end portion which is opposite to the first end portion and which opens in a vicinity of an upper surface of an upper portion of the endless belt.

20. An apparatus according to claim 1, wherein each of the objects is an electric component which has a generally rectangular-parallelopiped shape.

* * * * *